(12) United States Patent
Lim et al.

(10) Patent No.: US 11,445,597 B2
(45) Date of Patent: Sep. 13, 2022

(54) ELECTRONIC DEVICE INCLUDING CONNECTION STRUCTURE FOR ELECTRICALLY CONNECTING PRINTED CIRCUIT BOARD AND HOUSING

(71) Applicant: SAMSUNG ELECTRONICS CO., LTD., Suwon-si (KR)

(72) Inventors: Wonsub Lim, Suwon-si (KR); Hyoseok Na, Suwon-si (KR); Wanjae Ju, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 119 days.

(21) Appl. No.: 16/881,399

(22) Filed: May 22, 2020

(65) Prior Publication Data
US 2020/0375020 A1 Nov. 26, 2020

(30) Foreign Application Priority Data
May 23, 2019 (KR) .................. 10-2019-0060862

(51) Int. Cl.
*H05K 1/00* (2006.01)
*H05K 1/02* (2006.01)
(Continued)

(52) U.S. Cl.
CPC ......... *H05K 1/0215* (2013.01); *G06F 1/1626* (2013.01); *H01Q 1/24* (2013.01);
(Continued)

(58) Field of Classification Search
CPC .... H05K 1/0215; H05K 1/113; G06F 1/1626; H01Q 1/24; H01Q 1/38; H01R 4/04; H01R 12/51; H01R 12/721
(Continued)

(56) References Cited

U.S. PATENT DOCUMENTS

| 8,698,680 B2 | 4/2014 | Gutschenritter et al. |
| 10,010,005 B2 | 6/2018 | Hyun et al. |

(Continued)

FOREIGN PATENT DOCUMENTS

| EP | 2782133 | 9/2014 | |
| EP | 2782133 A2 * | 9/2014 | ........... H01L 23/047 |

(Continued)

OTHER PUBLICATIONS

International Search Report dated Sep. 15, 2020 in corresponding International Application No. PCT/KR2020/006694.

(Continued)

*Primary Examiner* — Andargie M Aychillhum
(74) *Attorney, Agent, or Firm* — Nixon & Vanderhye P.C.

(57) ABSTRACT

Disclosed is an electronic device that includes a first cover, a second cover opposite the first cover, a side housing disposed between the first cover and the second cover and including a plate disposed between the first cover and the second cover and a frame surrounding the plate and connected with the first cover and the second cover, a display disposed between the plate and the first cover, and a printed circuit board disposed between the plate and the second cover and including a first surface facing the plate, a second surface facing the second cover, and side surfaces provided between the first surface and the second surface, at least some of the side surfaces including plated areas. The plate includes a connection structure to which the printed circuit board is electrically connected, the connection structure includes a recess, the recess including a first sidewall, a second sidewall facing the first sidewall, a first conductive structure comprising a conductive material disposed on the first sidewall, and a second conductive structure comprising a conductive material disposed on the second sidewall, and at least part of the printed circuit board is disposed in the (Continued)

recess such that the plated areas contact the first conductive structure and the second conductive structure.

20 Claims, 14 Drawing Sheets

(51) Int. Cl.
| | |
|---|---|
| *G06F 1/16* | (2006.01) |
| *H01Q 1/24* | (2006.01) |
| *H01Q 1/38* | (2006.01) |
| *H01R 4/04* | (2006.01) |
| *H01R 12/51* | (2011.01) |
| *H01R 12/72* | (2011.01) |
| *H01R 33/02* | (2006.01) |
| *H05K 5/00* | (2006.01) |
| *H05K 1/11* | (2006.01) |
| *H05K 1/14* | (2006.01) |

(52) U.S. Cl.
CPC ................ *H01Q 1/38* (2013.01); *H01R 4/04* (2013.01); *H01R 12/51* (2013.01); *H01R 12/721* (2013.01); *H01R 33/02* (2013.01); *H05K 5/006* (2013.01); *H05K 1/113* (2013.01); *H05K 1/148* (2013.01); *H05K 5/0017* (2013.01); *H05K 2201/09981* (2013.01); *H05K 2201/10098* (2013.01)

(58) Field of Classification Search
USPC ........................................................ 361/749
See application file for complete search history.

(56) References Cited

U.S. PATENT DOCUMENTS

| | | | |
|---|---|---|---|
| 10,185,376 B2 | 1/2019 | Jun et al. | |
| 2012/0194998 A1* | 8/2012 | McClure | ............... G06F 1/1626 |
| | | | 361/679.56 |
| 2013/0181873 A1 | 7/2013 | Gutschenritter et al. | |
| 2014/0075743 A1 | 3/2014 | Mcclure et al. | |
| 2014/0264788 A1 | 9/2014 | Masuda | |
| 2015/0109170 A1* | 4/2015 | Kang | .................. H05K 5/0239 |
| | | | 343/702 |
| 2016/0157373 A1 | 6/2016 | Masuda | |
| 2016/0179135 A1* | 6/2016 | Kumagai | ................ G06F 1/183 |
| | | | 361/679.31 |
| 2016/0329626 A1 | 11/2016 | Jeon et al. | |
| 2017/0055353 A1 | 2/2017 | Park et al. | |
| 2017/0135239 A1 | 5/2017 | Hyun et al. | |
| 2017/0294932 A1 | 10/2017 | Kang et al. | |
| 2017/0308123 A1 | 10/2017 | Mcclure et al. | |
| 2018/0299929 A1 | 10/2018 | Kim et al. | |
| 2018/0358993 A1 | 12/2018 | Kang et al. | |
| 2019/0173984 A1 | 6/2019 | Kang et al. | |
| 2020/0117235 A1 | 4/2020 | Mcclure et al. | |
| 2020/0128115 A1 | 4/2020 | Kang et al. | |

FOREIGN PATENT DOCUMENTS

| | | |
|---|---|---|
| EP | 3389348 | 10/2018 |
| JP | 2007-129092 | 5/2007 |
| KR | 10-2017-0004259 A | 1/2017 |
| WO | 2011/047792 | 4/2011 |
| WO | 2013/129154 | 9/2016 |

OTHER PUBLICATIONS

Partial European Search Report and Written Opinion dated Oct. 23, 2020 in corresponding European Application No. 20176031.1.
European Search Report and Written Opinion dated Mar. 4, 2021 in corresponding European Application No. 20176031.1.
India Office Action dated Apr. 21, 2022 for IN Application No. 202117053041.

* cited by examiner

ELECTRONIC DEVICE INCLUDING CONNECTION STRUCTURE FOR ELECTRICALLY CONNECTING PRINTED CIRCUIT BOARD AND HOUSING

CROSS-REFERENCE TO RELATED APPLICATION

This application is based on and claims priority under 35 U.S.C. § 119 to Korean Patent Application No. 10-2019-0060862, filed on May 23, 2019, in the Korean Intellectual Property Office, the disclosure of which is incorporated by reference herein its entirety.

BACKGROUND

1. Field

The disclosure relates to a connection structure for electrically connecting a printed circuit board and a housing, and an electronic device including the connection structure.

2. Description of Related Art

Recently, electronic devices have been made slimmer. As the electronic devices are widely used due to an improvement in the performance of the electronic devices, the electronic devices may include a high-capacity battery and may be equipped with various parts. Accordingly, mounting spaces in the electronic devices need to be efficiently used. For example, an electronic device may include two printed circuit boards disposed on opposite sides of a battery.

With the development of communication technology, an electronic device may include an antenna that operates at a higher frequency than a conventional one. In the case of a conventional antenna operating at a relatively low frequency (e.g., 3 GHz or less), a metal portion included in a housing may be formed as a radiator. However, an antenna operating at a relatively high frequency (e.g., 6 GHz or more) may include a separate antenna substrate.

A printed circuit board of an electronic device may be electrically connected to a metal portion of a housing. When the electronic device includes two or more printed circuit boards, the electronic device may include a connection structure in which one of the printed circuit boards is electrically connected to the metal portion of the housing and the remaining printed circuit boards are connected to the one printed circuit board by cables. When a printed circuit board including an antenna pattern operating at a high frequency is connected by a cable connection method, sufficient grounding may not be provided.

The above information is presented as background information only to assist with an understanding of the disclosure. No determination has been made, and no assertion is made, as to whether any of the above might be applicable as prior art with regard to the disclosure.

SUMMARY

Embodiments of the disclosure address at least the above-mentioned problems and/or disadvantages and to provide at least the advantages described below. Accordingly, embodiments of the disclosure provide a connection structure for electrically connecting a printed circuit board to a metal portion of a housing, and an electronic device including the connection structure.

In accordance with an example embodiment of the disclosure, an electronic device includes: a first cover, a second cover opposite the first cover, a side housing disposed between the first cover and the second cover including a plate structure provided between the first cover and the second cover and a frame surrounding the plate structure, the frame being connected with the first cover and the second cover, a display disposed between the plate structure and the first cover, and a printed circuit board disposed between the plate structure and the second cover, the printed circuit board including a first surface facing the plate structure, a second surface facing the second cover, and side surfaces provided between the first surface and the second surface, wherein at least some of the side surfaces include plated areas. The plate structure includes a connection structure to which the printed circuit board is electrically connected, the connection structure includes a recess having a first sidewall, a second sidewall facing the first sidewall, a first conductive structure comprising a conductive material disposed on the first sidewall, and a second conductive structure comprising a conductive material disposed on the second sidewall, wherein at least part of the printed circuit board is disposed in the recess such that the plated areas make contact with the first conductive structure and the second conductive structure.

In accordance with another example embodiment of the disclosure, an electronic device includes: a housing, a bracket disposed in the housing, the bracket including a metal portion comprising a metallic material, a recess including a bottom surface and a pair of sidewalls facing each other, at least part of the recess being disposed on the metal portion of the bracket, a conductive member comprising a conductive material disposed between the pair of sidewalls of the recess, and a printed circuit board seated on a surrounding area around the recess and facing the bottom surface of the recess and that includes a first surface contacting the conductive member and a second surface opposite the first surface. Each of the pair of sidewalls includes a protrusion protruding toward the conductive member, and the conductive member is provided in a compressed state and configured to press the first surface of the printed circuit board while being supported on the bottom surface.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

With regard to description of the drawings, identical or similar reference numerals may be used to refer to identical or similar components.

DETAILED DESCRIPTION

Hereinafter, various example embodiments of the disclosure will be described with reference to the accompanying drawings. However, those of ordinary skill in the art will recognize that various modifications, equivalents, and/or alternatives on the various example embodiments described herein may be variously made without departing from the scope and spirit of the disclosure.

Figure 1:
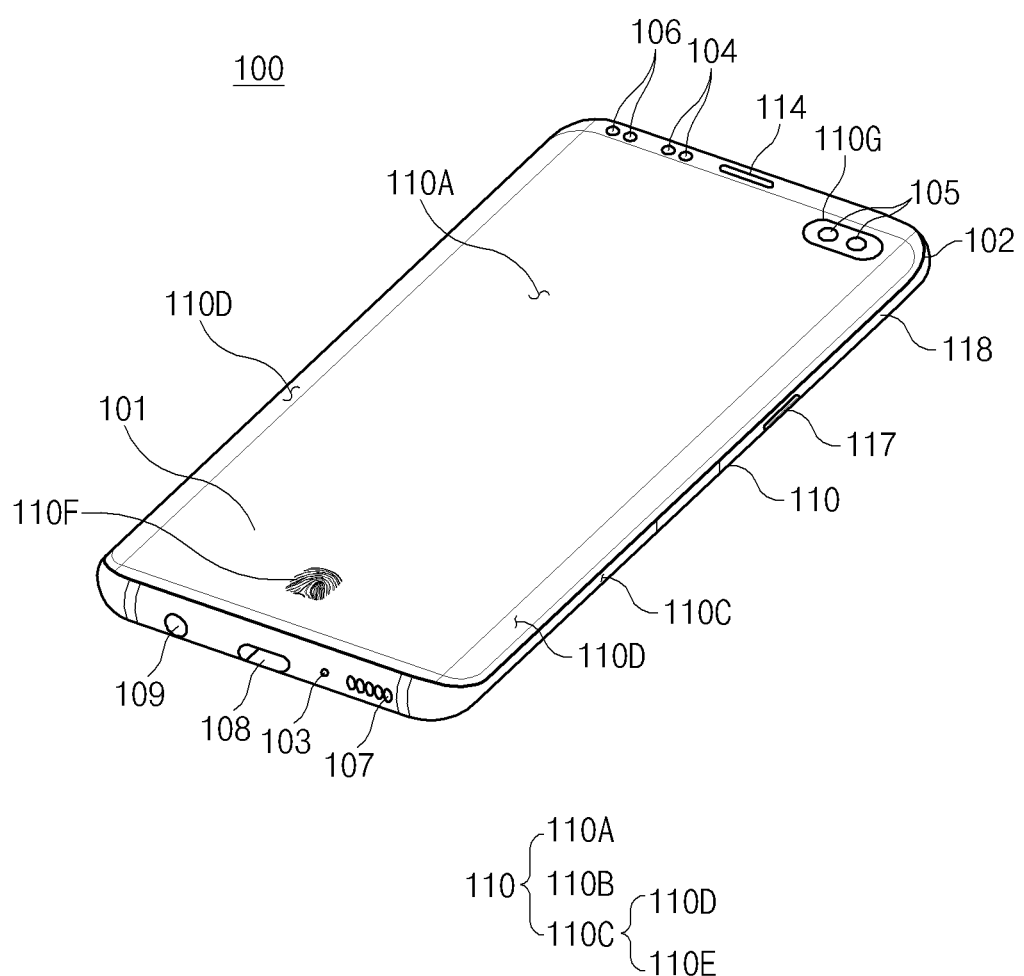
FIG. 1 is a front perspective view illustrating an example electronic device according to an embodiment.
Figure 2:
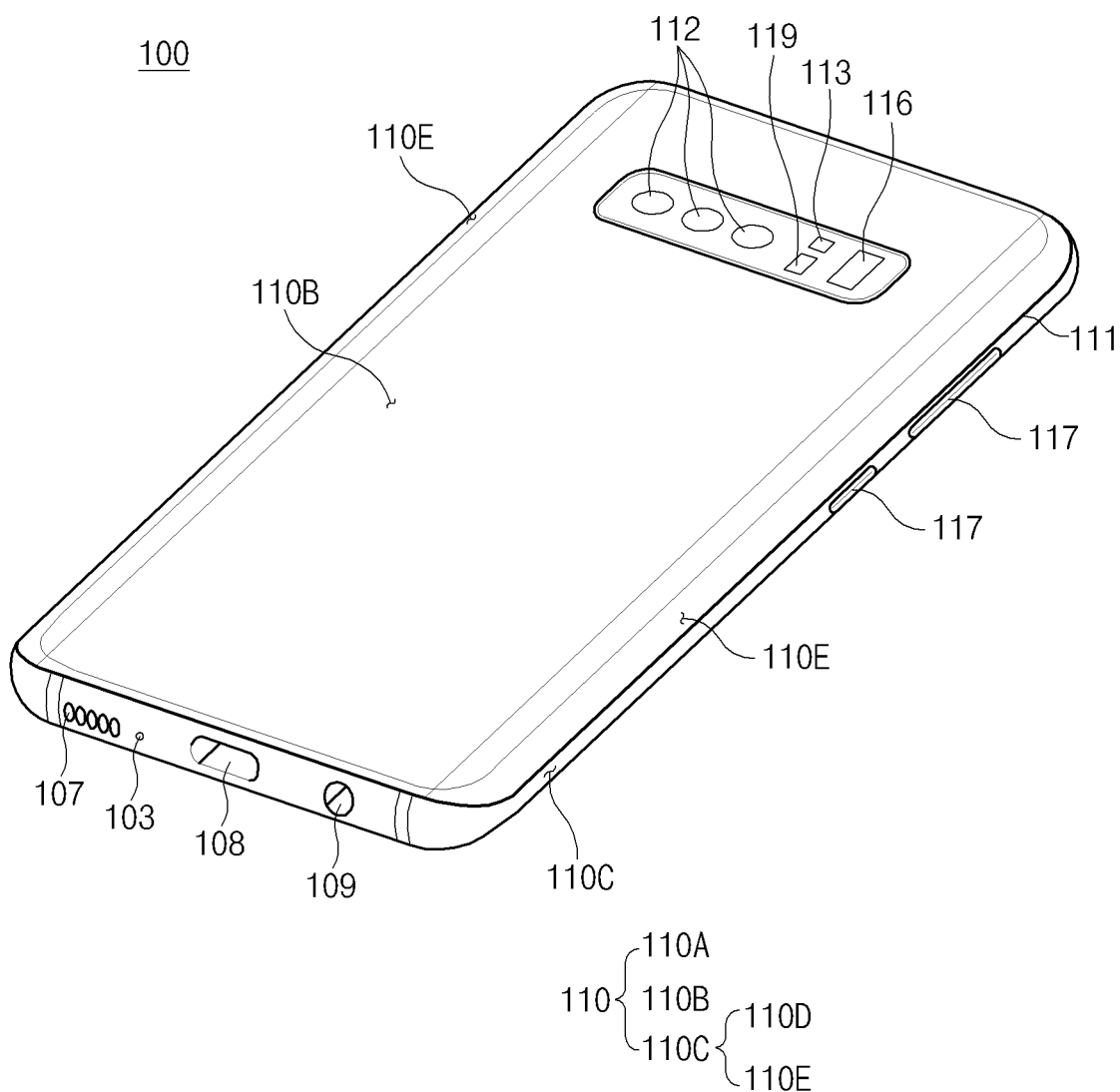
FIG. 2 is a rear perspective view illustrating the electronic device according to an embodiment.

FIG. 1 is a front perspective view illustrating an example electronic device according to an embodiment. FIG. 2 is a rear perspective view of the electronic device according to an embodiment.

Referring to FIGS. 1 and 2, the electronic device 100 according to an embodiment may include a housing 110 that includes a first surface (or a front surface) 110A, a second surface (or a rear surface) 110B, and side surfaces 110C that surround a space between the first surface 110A and the second surface 110B.

In another embodiment (not illustrated), the housing 110 may refer to a structure that forms some of the first surface 110A, the second surface 110B, and the side surfaces 110C of FIG. 1.

According to an embodiment, the first surface 110A may be formed by a front plate 102, at least part of which is substantially transparent (e.g., a glass plate including various coating layers, or a polymer plate). The second surface 110B may be formed by a back plate 111 that is substantially opaque. The back plate 111 may be formed by, for example, coated or colored glass, ceramic, a polymer, metal (e.g., aluminum, stainless steel (STS), or magnesium), or a combination of at least two thereof. The side surfaces 110C may be formed by a side bezel structure (or a "side member") 118 that is coupled with the front plate 102 and the back plate 111 and that contains metal and/or a polymer.

In some embodiments, the back plate 111 and the side bezel structure 118 may be integrally formed with each other and may contain the same material (e.g., a metallic material such as aluminum).

In the illustrated embodiment, the front plate 102 may include, at opposite long edges thereof, two first areas 110D that curvedly and seamlessly extend toward the back plate 111 from the first surface 110A.

In the illustrated embodiment (refer to FIG. 2), the back plate 111 may include, at opposite long edges thereof, two second areas 110E that curvedly and seamlessly extend toward the front plate 102 from the second surface 110B.

In some embodiments, the front plate 102 (or the back plate 111) may include only one of the first areas 110D (or the second areas 110E). In another embodiment, the front plate 102 (or the back plate 111) may not include a part of the first areas 110D (or the second areas 110E).

In the embodiments, when viewed from a side of the electronic device 100, the side bezel structure 118 may have a first thickness (or width) at sides (e.g., short sides) not including the first areas 110D or the second areas 110E and may have a second thickness at sides (e.g., long sides) including the first areas 110D or the second areas 110E, the second thickness being smaller than the first thickness.

According to an embodiment, the electronic device 100 may include at least one of a display 101, audio modules 103, 107, and 114, sensor modules 104, 116, and 119, camera modules 105, 112, and 113, key input devices 117, a light emitting element 106, and connector holes 108 and 109. In some embodiments, the electronic device 100 may not include at least one component (e.g., the key input devices 117 or the light emitting element 106) among the aforementioned components, or may additionally include other component(s).

The display 101 may be viewable through, for example, a large portion of the front plate 102. In some embodiments, at least part of the display 101 may be exposed through the front plate 102 that includes the first surface 110A and the first areas 110D of the side surfaces 110C.

In some embodiments, the periphery of the display 101 may be formed to be substantially the same as the shape of the adjacent outside edge of the front plate 102. In another embodiment (not illustrated), the gap between the periphery of the display 101 and the periphery of the front plate 102 may be substantially constant to expand the area by which the display 101 is exposed.

In an embodiment, a surface of the housing 110 (or the front plate 102) may include a screen display area that is formed as the display 101 is visually exposed. For example, the screen display area may include the first surface 110A and the first areas 110D of the side surfaces 110C.

In the illustrated embodiment, the screen display area 110A and 110D may include a sensing area 110F configured to obtain biometric information of a user. Here, when the screen display area 110A and 110D includes the sensing area 110F, at least part of the sensing area 110F may overlap the screen display area 110A and 110D. In other words, the sensing area 110F may refer to an area capable of displaying visual information by the display 101 similarly to the other areas of the screen display area 110A and 110D and additionally obtaining the user's biometric information (e.g., fingerprint).

In the illustrated embodiment, the screen display area 110A and 110D of the display 101 may include an area 110G through which the first camera device 105 (e.g., a punch hole camera) is visually exposed. At least part of the periphery of the area 110G, through which the first camera device 105 is exposed, may be surrounded by the screen display area 110A and 110D. In various embodiments, the first camera device 105 may include a plurality of camera devices.

In another embodiment (not illustrated), recesses or openings may be formed in the screen display area 110A and 110D of the display 101, and the electronic device 100 may include at least one of the audio module 114, the first sensor module 104, and the light emitting element 106 that are aligned with the recesses or the openings.

In another embodiment (not illustrated), the display 101 may include, on a rear surface of the screen display area 110A and 110D, at least one of the audio module 114, the sensor modules 104, 116, and 119, and the light emitting element 106.

In another embodiment (not illustrated), the display 101 may be coupled with, or disposed adjacent to, touch detection circuitry, a pressure sensor for measuring the intensity (pressure) of a touch, and/or a digitizer for detecting a stylus pen of a magnetic type.

In some embodiments, at least a part of the sensor modules 104, 116, and 119 and/or at least a part of the key input devices 117 may be disposed on the side surfaces 110C (e.g., the first areas 110D and/or the second areas 110E).

The audio modules 103, 107, and 114 may include the microphone hole 103 and the speaker holes 107 and 114. A microphone for obtaining a sound from the outside may be disposed in the microphone hole 103, and in some embodiments, a plurality of microphones may be disposed in the microphone hole 103 to sense the direction of a sound. The speaker holes 107 and 114 may include the external speaker hole 107 and the receiver hole 114 for a telephone call. In some embodiments, the speaker holes 107 and 114 and the microphone hole 103 may be implemented with one hole, and a speaker (e.g., a piezoelectric speaker) may be included without the speaker holes 107 and 114.

The sensor modules 104, 116, and 119 may generate an electrical signal or a data value that corresponds to an operational state inside the electronic device 100 or an environmental state external to the electronic device 100. For example, the sensor modules 104, 116, and 119 may include the first sensor module 104 (e.g., a proximity sensor) that is disposed on the first surface 110A of the housing, the second sensor module 116 (e.g., a TOF camera device) that is disposed on the second surface 110B of the housing 110, the third sensor module 119 (e.g., an HRM sensor) that is disposed on the second surface 110B of the housing 110, and/or the fourth sensor module (e.g., a sensor 190 of FIG. 3) (e.g., a fingerprint sensor) that is coupled to the display 101.

In various embodiments, the second sensor module 116 may include a TOF camera device for measurement of distance.

In various embodiments, at least part of the fourth sensor module (e.g., the sensor 190 of FIG. 3) may be disposed under the screen display area 110A and 110D. For example, the fourth sensor module may be disposed in a recess (e.g., a recess 139 of FIG. 3) that is formed on a rear surface of the display 101. That is, the fourth sensor module (e.g., the sensor 190 of FIG. 3) may not be exposed on the screen display area 110A and 110D and may form the sensing area 110F on at least part of the screen display area 110A and 110D.

In some embodiments (not illustrated), the fingerprint sensor may be disposed on the second surface 110B as well as the first surface 110A of the housing 110 (e.g., the screen display area 110A and 110D).

In various embodiments, the electronic device 100 may further include a non-illustrated sensor module, which may be, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112, and 113 may include the first camera device 105 (e.g., a punch hole camera device) that is exposed through the first surface 110A of the electronic device 100, and the second camera device 112 and/or the flash 113 exposed through the second surface 110B of the electronic device 100.

In the illustrated embodiment, the first camera device 105 may be exposed through part of the screen display area 110D of the first surface 110A. For example, the first camera device 105 may be exposed on a partial area of the screen display area 110D through an opening (not illustrated) that is formed in part of the display 101.

In the illustrated embodiment, the second camera device 112 may include a plurality of camera devices (e.g., a dual camera or a triple camera). However, the second camera device 112 is not necessarily limited to including the plurality of camera devices, and may include one camera device.

The camera devices 105 and 112 may include one or more lenses, an image sensor, and/or an image signal processor. The flash 113 may include, for example, a light emitting diode or a xenon lamp. In some embodiments, two or more lenses (an IR camera lens, a wide angle lens, and a telephoto lens) and image sensors may be disposed on one surface of the electronic device 100.

The key input devices 117 may be disposed on the side surfaces 110C of the housing 110. In another embodiment, the electronic device 100 may not include all or some of the aforementioned key input devices 117, and the key input devices 117 not included may be implemented in a different form, such as a soft key, on the display 101. In some embodiments, the key input devices may include a sensor module (e.g., the sensor 190 of FIG. 3) that forms the sensing area 110F included in the screen display area 110A and 110D.

The light emitting element 106 may be disposed on, for example, the first surface 110A of the housing 110. For example, the light emitting element 106 may provide state information of the electronic device 100 in the form of light. In another embodiment, the light emitting element 106 may provide, for example, a light source that operates in conjunction with the first camera device 105. The light emitting element 106 may include, for example, an LED, an IR LED, and a xenon lamp.

The connector holes 108 and 109 may include the first connector hole 108 for receiving a connector (e.g., a USB connector) for transmitting and receiving power and/or data with an external electronic device, and/or the second connector hole 109 (e.g., an earphone jack) for receiving a connector for transmitting and receiving audio signals with an external electronic device.

Figure 3:
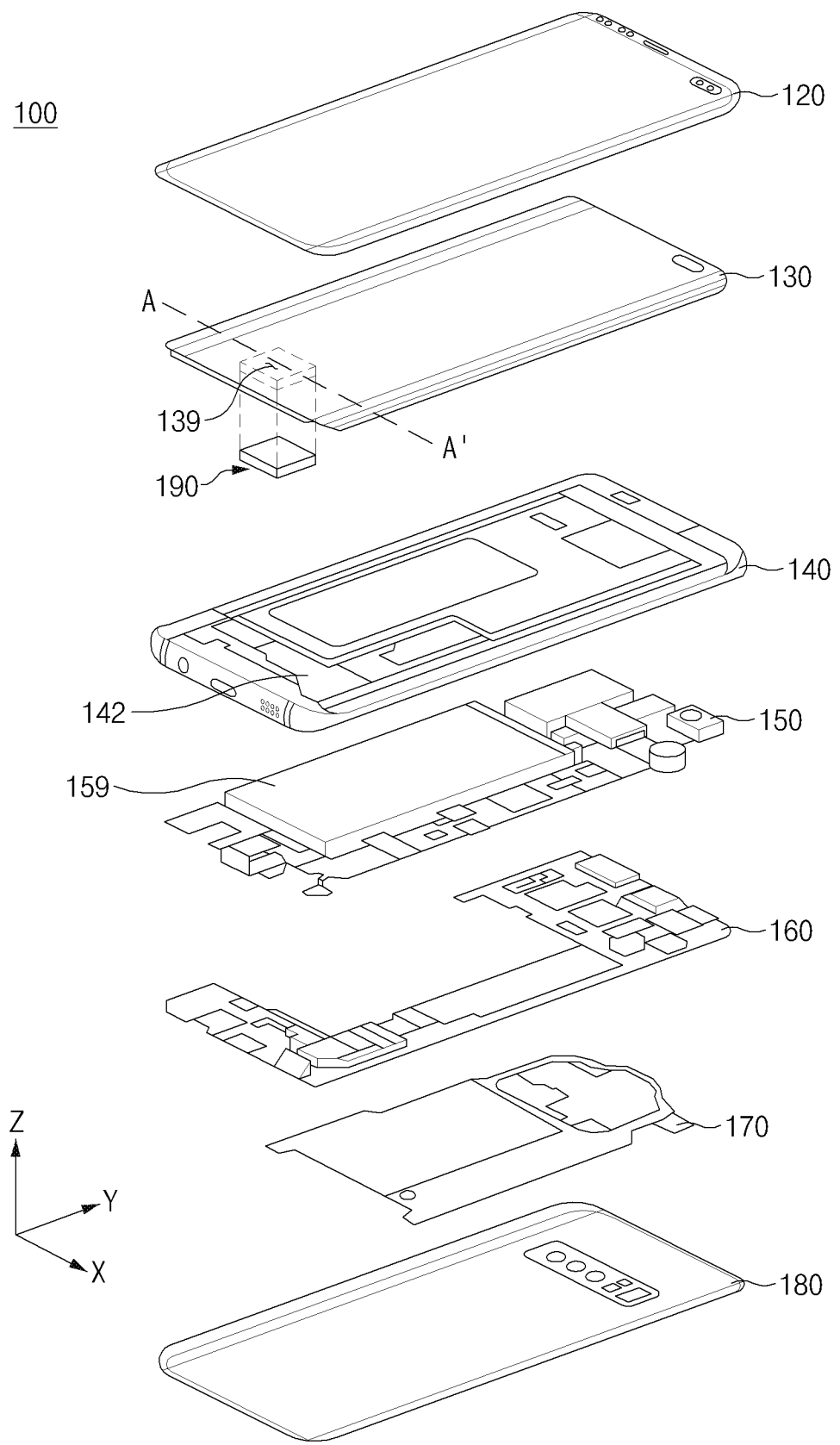
FIG. 3 is an exploded perspective view illustrating the electronic device according to an embodiment.

FIG. 3 is an exploded perspective view illustrating the electronic device of FIG. 1 according to an embodiment.

Referring to FIG. 3, the electronic device 100 may include a first cover 120 (e.g., the front surface 110A and the first areas 110D of FIG. 1), a display 130 (e.g., the display 101 of FIG. 1), a side member 140 (e.g., a side housing including a part of the side surfaces 110C of FIG. 1), a first support member 142 (e.g., a bracket), a printed circuit board 150, a battery 159, a mid-plate 160 (e.g., a rear case), an antenna 170, and a second cover 180 (e.g., the rear surface 110B and the second areas 110E of FIG. 1). In some embodiments, the electronic device 100 may not include at least one component (e.g., the first support member 142 or the mid-plate 160) among the aforementioned components, or may additionally include other component(s). At least one of the components of the electronic device 100 may be the same as, or similar to, at least one of the components of the electronic device 100 of FIG. 1 or FIG. 2, and repetitive descriptions may not be repeated here.

The first support member 142 may be disposed in the electronic device 100 and may be connected with the side member 140, or may be integrally formed with the side member 140. The first support member 142 may be formed of, for example, a metallic material and/or a nonmetallic (e.g., polymer) material. The display 130 may be coupled to one surface of the first support member 142, and the printed circuit board 150 may be coupled to an opposite surface of the first support member 142. A processor, a memory, and/or an interface may be mounted on the printed circuit board 150. The processor may include, for example, one or more of a central processing unit, an application processor, a graphic processing unit, an image signal processor, a sensor hub processor, or a communication processor.

The memory may include, for example, a volatile memory or a nonvolatile memory.

The interface may include, for example, a high definition multimedia interface (HDMI), a universal serial bus (USB) interface, an SD card interface, and/or an audio interface. The interface, for example, may electrically or physically connect the electronic device 100 with an external electronic device and may include a USB connector, an SD card/MMC connector, or an audio connector.

The battery 159, which is a device for supplying power to at least one component of the electronic device 100, may include, for example, a primary cell that is not rechargeable, a secondary cell that is rechargeable, or a fuel cell. For example, at least part of the battery 159 may be disposed on substantially the same plane as the printed circuit board 150. The battery 159 may be integrally disposed in the electronic device 100 and may be disposed so as to be detachable from the electronic device 100.

The antenna 170 may be disposed between the second cover 180 and the battery 159. The antenna 170 may include, for example, a near field communication (NFC) antenna, a wireless charging antenna, and/or a magnetic secure transmission (MST) antenna. For example, the antenna 170 may perform short range communication with an external device, or may wirelessly transmit and receive power required for charging. In another embodiment, an antenna structure may be formed by the side member 140 and/or part of the first support member 142, or a combination thereof.

In the illustrated embodiment, the electronic device 100 may further include the sensor 190 coupled to the display 130. The sensor 190 may be disposed in the recess 139 formed on a rear surface of the display 130. The sensor 190 may form a sensing area (e.g., the sensing area 110F of FIG. 1) on part of the first cover 120.

Figure 4:
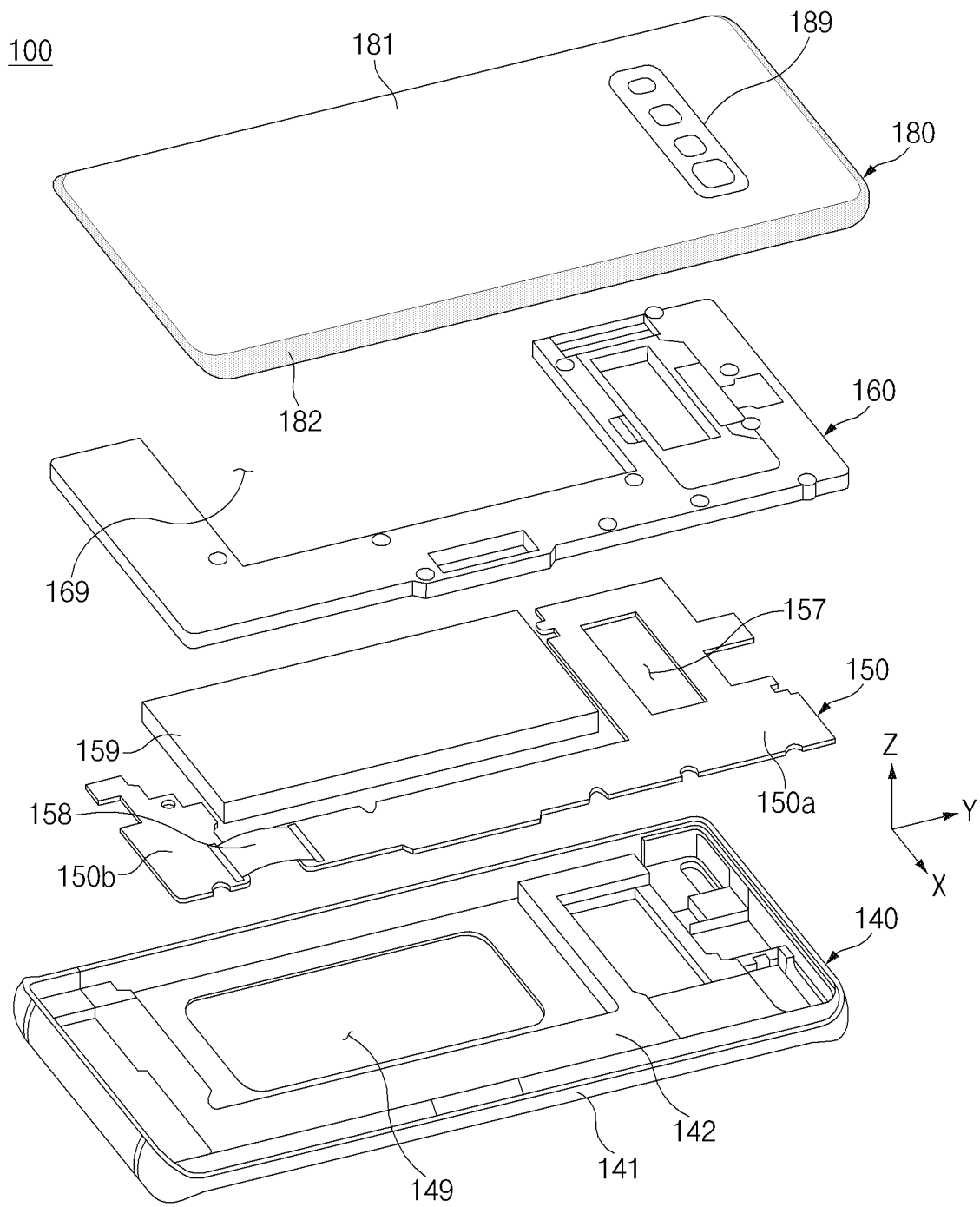
FIG. 4 is an exploded perspective view illustrating a rear side of the electronic device according to various embodiments.
Figure 5:
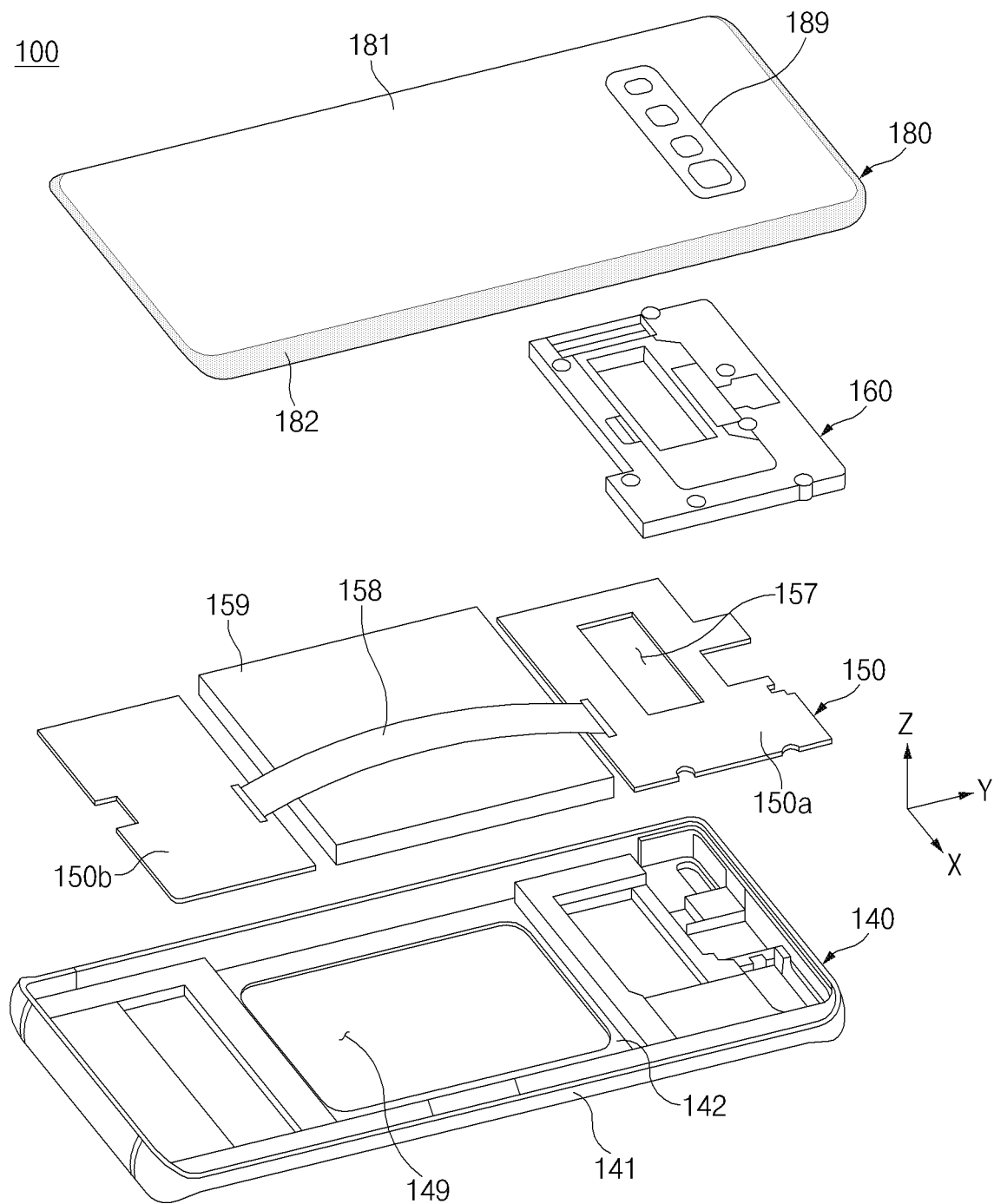
FIG. 5 is an exploded perspective view illustrating the rear side of the electronic device according to various embodiments.

FIG. 4 is an exploded perspective view illustrating a rear side of the electronic device 100 according to various embodiments. FIG. 5 is an exploded perspective view illustrating the rear side of the electronic device 100 according to various embodiments.

In the illustrated embodiment, the electronic device 100 may include the side member 140, the printed circuit board 150, the battery 159, the mid-plate 160, and the second cover 180.

In the illustrated embodiment, the second cover 180 may form a surface (e.g., a rear surface) of the electronic device 100. The second cover 180 may include a flat area 181 formed to be a plane substantially facing a second direction (e.g., an upper direction with respect to the drawings) and a curved area 182 formed at the periphery of the flat area 181. The curved area 182 may be connected with a frame structure or portion 141 of the side member 140 to form a space inside. The second cover 180 may include a camera area 189 through which a camera device (e.g., the camera module 112 of FIG. 2) is visually exposed. The camera area 189 may be formed in the flat area 181 of the second cover 180. The camera area 189 may be formed to be substantially transparent such that external light is incident on a camera lens through the camera area 189. In some embodiments, the second cover 180 may form part of the housing of the electronic device 100.

In the illustrated embodiment, the side member 140 may include the plate structure 142 on which the printed circuit board 150 is disposed and the frame structure or portion 141 that surrounds the plate structure 142. The frame structure 141 may form surfaces (e.g., side surfaces) of the electronic device 100. The frame structure 141 may be connected with the curved area 182 of the second cover 180 to form an interior space. The interior space may be formed between the plate structure 142 and the second cover 180. The printed circuit board 150 (e.g., a first printed circuit board 150a or a second printed circuit board 150b) and the mid-plate 160 may be disposed in the interior space. The plate structure 142 may have a swelling hole 149 formed therein in which at least part of the battery 159 is received when the battery 159 swells. The swelling hole 149 may be formed in a shape substantially corresponding to the shape of the battery 159.

In the illustrated embodiment, the mid-plate 160 may be disposed between the plate structure 142 and the second cover 180. The mid-plate 160 may be disposed between the printed circuit board 150 and the second cover 180. At least part of the mid-plate 160 may cover the printed circuit board 150. The mid-plate 160 may contain an insulating material. Referring to FIG. 4, the mid-plate 160 may have an opening 169 formed therein in which the battery 159 is disposed.

In the illustrated embodiment, the printed circuit board 150 may include the first printed circuit board 150a and the second printed circuit board 150b that may have a smaller size than the first printed circuit board 150a. The printed circuit board 150a may include an opening 157 in which a camera module is disposed. The battery 159 may be disposed between the first printed circuit board 150a and the second printed circuit board 150b. The first printed circuit board 150a and the second printed circuit board 150b may be electrically connected with each other by a connecting member 158 extending from the first printed circuit board 150a to the second printed circuit board 150b. The connecting member 158 may include, for example, a flexible printed circuit board (hereinafter, referred to as the FPCB) and/or a coaxial cable. In some embodiments, the first printed circuit board 150a and the second printed circuit board 150b may be integrally formed with each other. In various embodiments, a processor may be disposed on the first printed circuit board 150a, and a communication module may be disposed on the second printed circuit board 150b.

Referring to FIG. 4, the first printed circuit board 150a may extend along a long side direction (e.g., the y-axis direction) of the side member 140. The second printed circuit board 150b may extend along a short side direction (e.g., the x-axis direction) of the side member 140. The second printed circuit board 150b may be spaced apart from the first printed circuit board 150a. The connecting member 158 may connect the first printed circuit board 150a and the second printed circuit board 150b. The battery 159 illustrated in FIG. 4 may be formed to be longer in the long side direction (e.g., the y-axis direction) than the battery 159 illustrated in FIG. 5. The swelling hole 149 illustrated in FIG. 4 may be formed to be long in the long side direction (e.g., the y-axis direction) so as to correspond to the battery 159.

Referring to FIG. 5, the first printed circuit board 150a may be spaced apart from the second printed circuit board 150b with the battery 159 disposed therebetween. The connecting member 158 may extend across the battery 159 from the first printed circuit board 150a to the second printed circuit board 150b. The battery 159 illustrated in FIG. 5 may have a smaller ratio of the length in the long side direction (e.g., the y-axis direction) to the length in the short side direction (e.g., the x-axis direction) than the battery 159 illustrated in FIG. 4. Short sides (e.g., along the x-axis direction) and long sides (e.g., along the y-axis direction) of the swelling hole 149 illustrated in FIG. 5 may have substantially the same length to correspond to the battery 159, as compared to the swelling hole 149 illustrated in FIG. 4.

In various embodiments, the first printed circuit board 150a may be brought into contact with a metal portion of the side member 140. A ground area of the first printed circuit board 150a may be electrically grounded to the metal portion of the side member 140. In some embodiments, the second printed circuit board 150b may be grounded to the ground area of the first printed circuit board 150a by the connecting member 158.

In various embodiments, ground areas of the first printed circuit board 150a and the second printed circuit board 150b may be electrically connected to the metal portion of the side member 140. For example, the first printed circuit board 150a and the second printed circuit board 150b may be electrically grounded to the metal portion of the side member 140.

Figure 6:
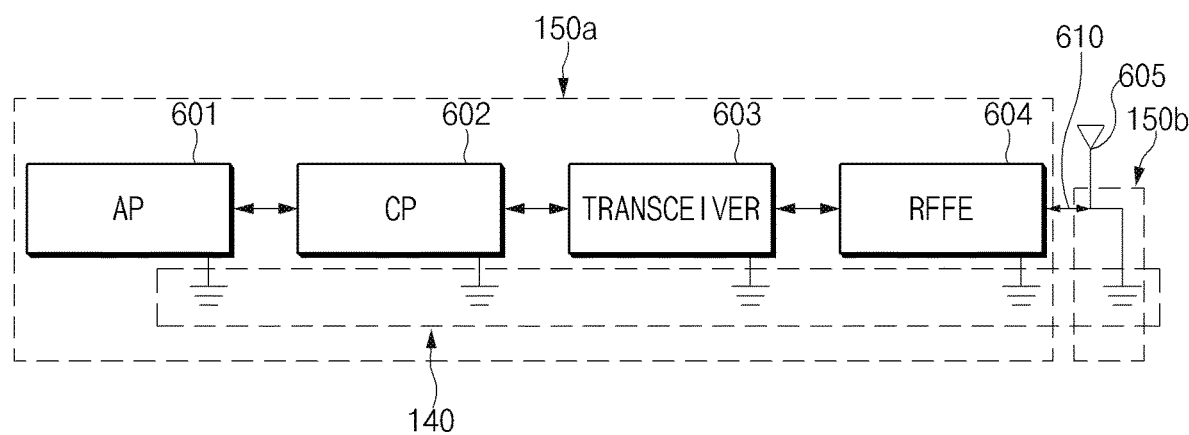
FIG. 6 is a diagram illustrating an example ground structure of a first printed circuit board and a second printed circuit board of the electronic device according to various embodiments.

FIG. 6 is a diagram illustrating an example ground structure of the first printed circuit board 150a and the second printed circuit board 150b of the electronic device 100 according to various embodiments.

In the illustrated embodiment, the first printed circuit board 150a and the second printed circuit board 150b may be electrically connected together to form the same ground area. The ground area may include the metal portion of the side member 140 (e.g., the plate structure 142 of FIG. 4).

In the illustrated embodiment, the first printed circuit board 150a may include, for example, and without limitation, at least one of an application processor (AP) 601, a communication processor (CP) 602, a transceiver 603, and a radio frequency (RF) front end (RFFE) 604. The components may be mounted on the first printed circuit board 150a. The components may be electrically connected by wiring formed on the first printed circuit board 150a. The components illustrated in the drawing is not necessarily limited to being mounted on the first printed circuit board 150a, and some of the components may be mounted on the second printed circuit board 150b.

In various embodiments, the application processor (AP) 601 may be electrically connected with the communication processor (CP) 602. The communication processor (CP) 602 may be electrically connected with the transceiver 603 and the application processor (AP) 601. The transceiver 603 may be electrically connected with the communication processor (CP) 602 and the RF front end (RFFE) 604. The RF front end (RFFE) 604 may apply a feeding signal to an antenna pattern 605. The communication processor (CP) 602 may be controlled by the application processor (AP) 601. The communication processor (CP) 602 may control the RF front end (RFFE) 604. The transceiver 603 may transmit a signal to the RF front end (RFFE) 604 and may receive a signal from the RF front end (RFFE) 604. The RF front end (RFFE) 604 may supply power to the antenna pattern 605 such that the antenna pattern 605 radiates electric waves.

In the illustrated embodiment, the antenna pattern 605 may be formed on part of the housing (e.g., the side member 140 of FIG. 4). For example, an insulating area (e.g., an injection-molded area) may be formed on part of an inner surface of the side member 140, and the antenna pattern 605 may be formed on part of the insulating area.

The second printed circuit board 150b may include, for example, a wiring pattern or a connecting member (e.g., a C-clip) that is electrically connected with the antenna pattern 605. The antenna pattern 605 may be electrically connected with the RF front end (RFFE) 604 included in the first printed circuit board 150a. For example, the antenna pattern 605 may be supplied with power by the RF front end (RFFE) 604 and may radiate electric waves having a predetermined frequency.

In some embodiments, the second printed circuit board 150b may include the antenna pattern 605. For example, the second printed circuit board 150b may include a 5G antenna module.

In various embodiments, the first printed circuit board 150a and the second printed circuit board 150b may include various connection structures such that electric elements mounted on the printed circuit boards have a common ground area. For example, the antenna pattern 605, the RF front end (RFFE) 604, the transceiver 603, the communication processor (CP) 602, and the application processor (AP) 601 may have a common ground area and may therefore be configured to be one closed circuit.

In various embodiments, ground areas of the first printed circuit board 150a and the second printed circuit board 150b may be electrically connected together through wiring included in a connecting member 610. For example, the connecting member 610 may include, for example, and without limitation, an FPCB or a coaxial cable that includes a plurality of wires. At least one of the plurality of wires may include a ground wire to which a ground signal is applied.

In various embodiments, the ground area of the first printed circuit board 150a may be electrically connected with the metal portion of the side member 140. The ground area of the second printed circuit board 150b may be electrically connected with the metal portion of the side member 140. For example, the first printed circuit board 150a and the second printed circuit board 150b may be electrically connected to the metal portion of the side member 140. For example, the first printed circuit board 150a and the second printed circuit board 150b may have a common ground area.

The printed circuit board 150 of the electronic device 100 according to various embodiments of the disclosure may include a connection structure electrically connected to the metal portion of the side member 140. In some embodiments, the printed circuit board 150 of the electronic device 100 may share each ground area through the wiring included in the connecting member 610, in addition to the connection structure.

Figure 7:
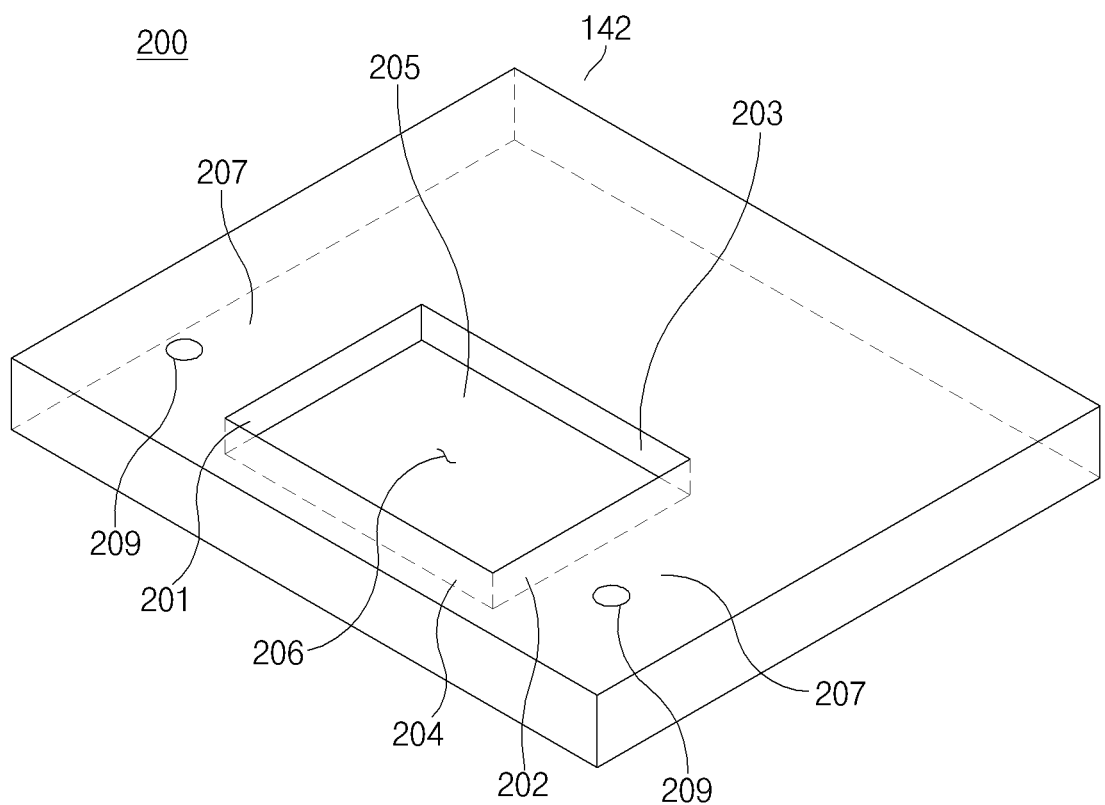
FIG. 7 is a diagram illustrating an example connection structure of the electronic device according to various embodiments.

FIG. 7 is a diagram illustrating an example electrical connection structure 200 of the electronic device 100 according to various embodiments.

In the illustrated embodiment, the connection structure 200 may include a recess 206 formed on the plate structure 142, and the recess 206 may include sidewalls 201, 202, 203, and 204 and a bottom surface 205 that form the recess 206.

In various embodiments, the sidewalls 201, 202, 203, and 204 may surround at least part of the recess 206. The sidewalls 201, 202, 203, and 204 may include the first sidewall 201, the second sidewall 202 facing the first sidewall 201, the third sidewall 203, and the fourth sidewall 204 facing the third sidewall 203. The sidewalls 201, 202, 203, and 204 may extend from the bottom surface 205. The bottom surface 205 may substantially face a printed circuit board (e.g., the printed circuit board 150 of FIGS. 4 and 5). The sidewalls 201, 202, 203, and 204 may be formed to be perpendicular to the bottom surface 205.

In various embodiments, the printed circuit board (e.g., the printed circuit board 150 of FIGS. 4 and 5) may be seated on a surrounding area 207 around the recess 206, or may be disposed in the recess 206 (e.g., on the bottom surface 205).

In the illustrated embodiment, the plate structure 142 may include fastening holes 209 formed in the surrounding area 207 around the recess 206. The fastening holes 209 may be aligned with corresponding fastening holes formed in the printed circuit board. The printed circuit board (e.g., the printed circuit board 150 of FIGS. 4 and 5) may be mounted on the plate structure 142. Fastening members (e.g., screws) may be inserted into the fastening holes 209 and the corresponding fastening holes.

FIGS. 8A, 8B, 9A, 9B, 10A, 10B and 10C are diagrams illustrating a coupling of a first connection structure 210 and the printed circuit board 150 of the electronic device 100 according to various embodiments.

In the illustrated embodiments, the first connection structure 210 may include a recess 216 (e.g., the recess 206 of FIG. 7) that is formed on the plate structure 142, a conductive member (e.g., including a conductive material) 218 disposed in the recess 216, the printed circuit board 150 seated on a surrounding area 217 (e.g., the surrounding area 207 of FIG. 7) around the recess 216, and fastening members 219. The recess 216 may include a first sidewall 211 (e.g., the first sidewall 201 of FIG. 7), a second sidewall 212 (e.g., the second sidewall 202 of FIG. 7) that faces the first sidewall 211, and a bottom surface 215 (e.g., the bottom surface 205 of FIG. 7) that is formed between the first sidewall 211 and the second sidewall 212. In an embodiment, the surrounding area 217 around the recess 216 may be formed of a metal portion included in the plate structure 142. For example, at least one of the first sidewall 211, the second sidewall 212, and the bottom surface 215 may be formed of the metal portion.

In the illustrated embodiments, the conductive member 218 may be disposed in the recess 216. For example, the conductive member 218 may be disposed on the bottom surface 215 of the recess 216.

In the illustrated embodiments, the printed circuit board 150 may be fixed to the plate structure 142 (e.g., the surrounding area 217 around the recess 216) by the fastening members 219. The fastening members 219 may be inserted into fastening holes (e.g., the fastening holes 209 of FIG. 6) that are formed in the plate structure 142. At this time, the printed circuit board 150 may press the conductive member 218 in a first direction F1.

The printed circuit board 150 may press a protruding portion of the conductive member 218 into the recess 216. The conductive member 218 pressed by the printed circuit board 150 may be compressed to fill the recess 216. For example, the conductive member 218 may include conductive foam.

In various embodiments, the printed circuit board 150 may include a conductive area including a ground area formed between a first surface 151 and a second surface 152. For example, the printed circuit board 150 may include a metal area 155 formed on the first surface 151 and brought into contact with the conductive member 218. The metal area 155 may be connected with the ground area included in the printed circuit board 150. For example, the metal area 155 may be electrically connected with the ground area through a VIA.

In various embodiments, the conductive member 218 may contain a conductive material and an elastic material. The conductive member 218 may be formed to exert an elastic force on the printed circuit board 150, which is seated on the plate structure 142, in a second direction F2 opposite to the first direction F1. For example, the conductive member 218 disposed in the recess 216 may protrude above a surface of the plate structure 142.

In the illustrated embodiments, at least part of the conductive member 218 in an equilibrium state (e.g., an uncompressed state) may protrude outside the recess 216. The conductive member 218 may be compressed in the recess 216 as the printed circuit board 150 is seated on the surrounding area 217 around the recess 216. The conductive member 218 may fill the recess 216. The conductive member 218 may be formed of an elastic material. To return to the original state, the compressed conductive member 218 may press the first surface 151 of the printed circuit board 150. For example, the printed circuit board 150 may be seated on the plate structure 142 in the first direction F1. The conductive member 218 may press the first surface 151 of the printed circuit board 150 in the second direction F2 opposite to the first direction F1. The conductive member 218 pressed by the printed circuit board 150 may make contact with the first sidewall 211, the second sidewall 212, and the bottom surface 215. The conductive member 218 may press the first sidewall 211, the second sidewall 212, and the bottom surface 215.

In the illustrated embodiments, sidewalls (e.g., the first sidewall 211 and the second sidewall 212) may include protrusions 261, 262, and 263 protruding toward the inside of the recess 216. The protrusions 261, 262, and 263 may be formed to damp the elastic force exerted on the first surface 151 of the printed circuit board 150 by the conductive member 218. For example, the printed circuit board 150 fixed to the plate structure 142 may be bent or damaged by the elastic force of the conductive member 218 that acts in the second direction F2. To prevent this problem, the protrusions 261, 262, and 263 may protrude toward the conductive member 218 to damp part of the elastic force of the conductive member 218.

In various embodiments, the first connection structure 210 may further include a conductive tape 213 containing a conductive material and an adhesive material. The conductive tape 213 may include a double-sided tape containing a conductive material. At least part of the conductive member 218 may be electrically connected with the bottom surface 215 through the conductive tape 213.

In various embodiments, the conductive tape 213 may be disposed between the conductive member 218 and the printed circuit board 150. For example, the conductive tape 213 may be formed in an area corresponding to the metal area 155 formed on the first surface 151 of the printed circuit board 150.

Figure 8A:
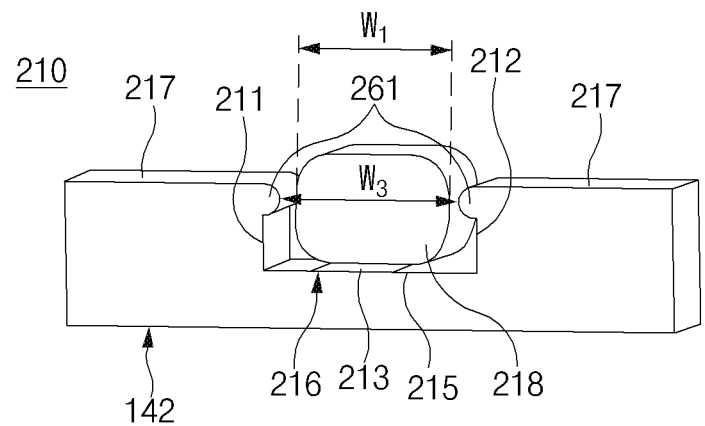
FIGS. 8A and 8B are diagrams illustrating an example first connection structure of the electronic device according to various embodiments.
Figure 8B:
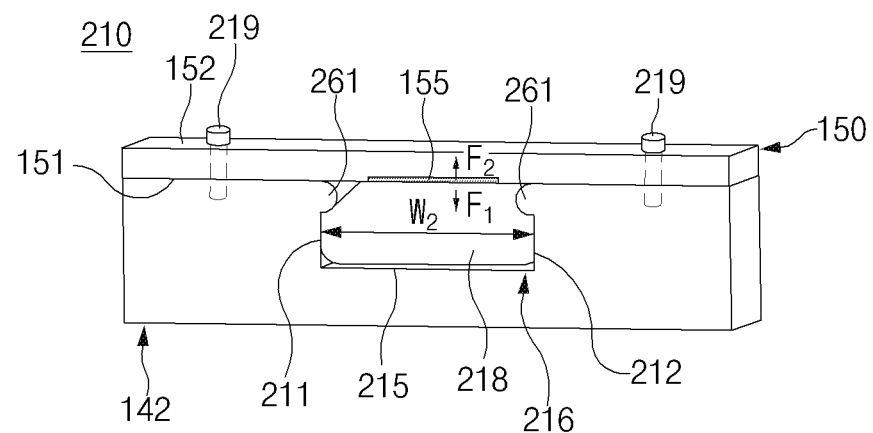

Referring to FIGS. 8A and 8B, the first protrusions 261 may be formed on the sidewalls 211 and 212, respectively. The sidewalls 211 and 212 may include first end portions connected with the surrounding area 217 around the recess 216 and second end portions connected with the bottom surface 215. The first protrusions 261 may be formed adjacent to the first end portions of the sidewalls 211 and 212. Accordingly, the first protrusions 261 may partly prevent the conductive member 218 from protruding outside the recess 216. Furthermore, the first protrusions 261 may damp part of the elastic force of the conductive member 218.

Figure 9A:
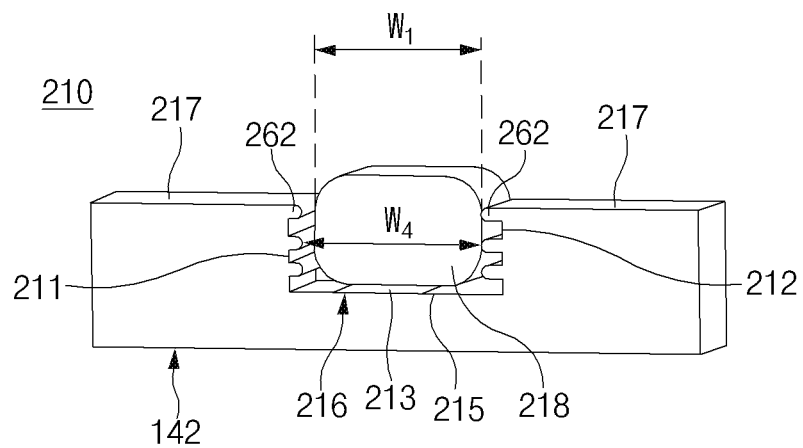
FIGS. 9A and 9B are diagrams illustrating an example first connection structure of the electronic device according to various embodiments.
Figure 9B:
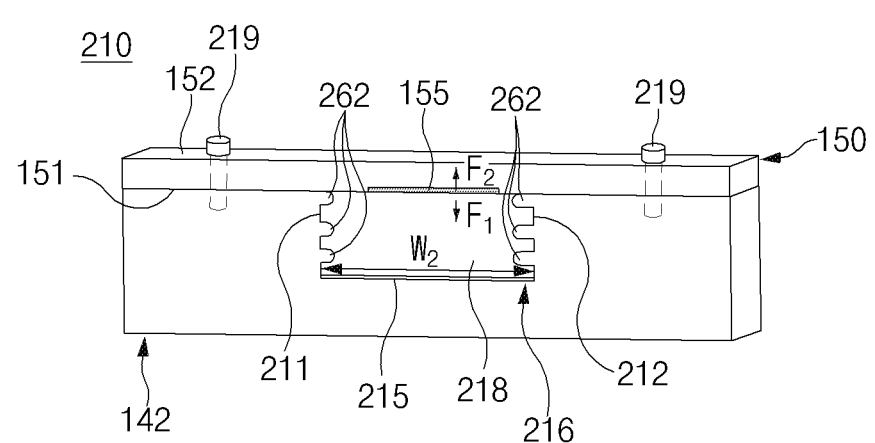

Referring to FIGS. 9A and 9B, the plurality of second protrusions 262 may be formed on each of the sidewalls 211 and 212. The plurality of second protrusions 262 may be formed to be smaller than the first protrusions 261, but are not necessarily limited thereto. When the printed circuit board 150 is seated on the plate structure 142, the conductive member 218 may fill spaces between the plurality of second protrusions 262. Accordingly, the plurality of second protrusions 262 may allow the conductive member 218 to remain located in the recess 216.

Figure 10A:
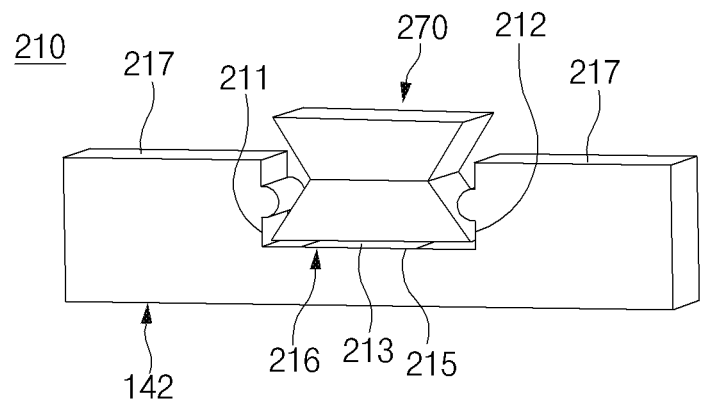
FIGS. 10A, 10B and 10C are diagrams illustrating an example first connection structure of the electronic device according to various embodiments.
Figure 10B:
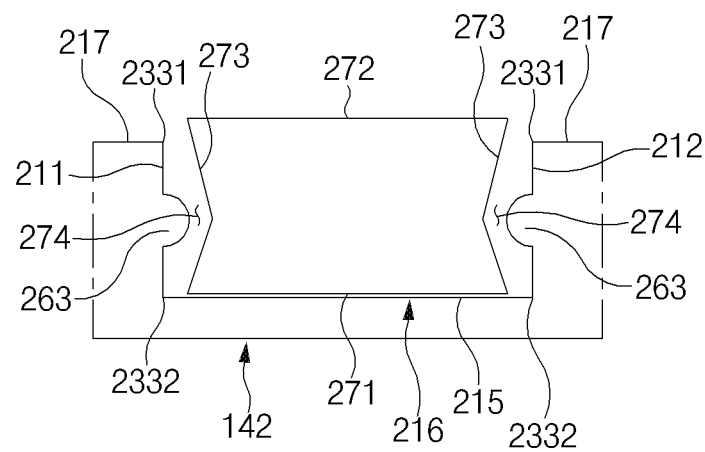
Figure 10C:
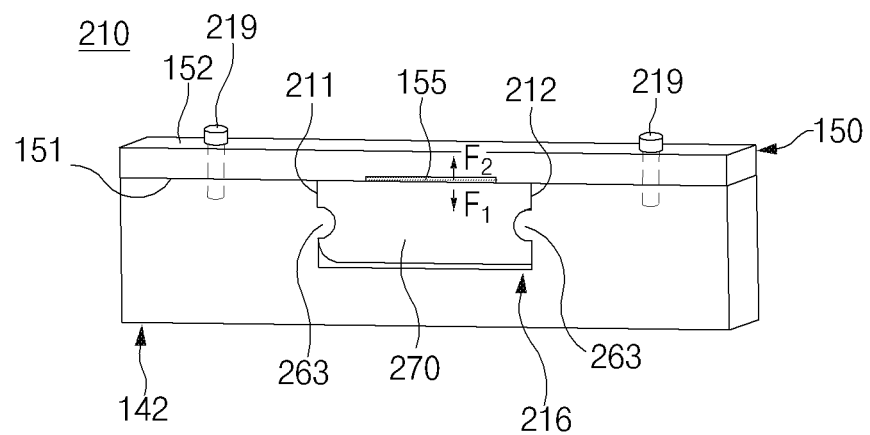

Referring to FIGS. 10A, 10B and 10C, the third protrusions 263 may be formed on the sidewalls 211 and 212, respectively. The sidewalls 211 and 212 may include first edges 2331 formed by the sidewalls 211 and 212 together with the surrounding area 217 around the recess 216 and second edges 2332 formed by the sidewalls 211 and 212 together with the bottom surface 215 of the recess 216. The third protrusions 263 may be formed between the first edges 2331 and the second edges 2332. When viewed in a depth direction of the recess 216, the third protrusions 263 may be formed closer to the bottom surface 215 than the first protrusions 261.

Referring to FIGS. 8A, 8B, 9A and 9B, in an equilibrium state, the conductive member 218 may have a first width W1, and in a compressed state, at least part of the conductive member 218 may have a second width W2 greater than the first width W1. The second width W2 may be greater than the distance W3 between the first protrusions 261 or the distance W4 between the second protrusions 262.

Referring to FIGS. 10A, 10B and 10C, a second conductive member 270 may be disposed in the recess 216. The second conductive member 270 may include a first surface 271 seated on the bottom surface 215, a second surface 272 making contact with the printed circuit board 150, and third surfaces 273 making contact with the sidewalls 211 and 212. The second conductive member 270 may include depressions 274 formed on the third surfaces 273 to correspond to the third protrusions 263. The third protrusions 263 may be received in the depressions 274. When the printed circuit board 150 is seated on the plate structure 142, surrounding portions around the depressions 274 may surround the third protrusions 263. Likewise to the first protrusions 261, the third protrusions 263 may prevent and/or reduce the likelihood of the second conductive member 270 from escaping from the recess 216. The third protrusions 263 may damp part of an elastic force of the second conductive member 270. Unlike the first protrusions 261, the third protrusions 263 may not decrease the contact area between the conductive member 270 and the printed circuit board 150.

Referring to FIGS. 8A, 8B, 9A, 9B, 10A, 10B and 10C, the first connection structure 210 is illustrated as including only the pair of sidewalls 211 and 212 facing each other. However, the first connection structure 210 of the disclosure may not be necessarily limited thereto. For example, the first connection structure 210 may further include another sidewall (e.g., the third sidewall 203 or the fourth sidewall 204 of FIG. 7) that connects the pair of sidewalls 211 and 212, or another pair of sidewalls (e.g., the third sidewall 203 and the fourth sidewall 204).

In various embodiments, the first connection structure 210 may include a conductive member (e.g., the conductive member 218 illustrated in FIGS. 8A, 8B, 9A and 9B or the conductive member 270 illustrated in FIGS. 10A, 10B and 10C) that is surrounded by sidewalls (e.g., the sidewalls 201, 202, 203, and 204 of FIG. 7), and protrusions (e.g., the protrusions 261, 262, and 263 illustrated in FIGS. 8A to 10C) that are formed on at least some of the sidewalls and that protrude toward the conductive member.

FIGS. 11A, 11B, 11C, 12A, 12B and 12C are diagrams illustrating example coupling of a second connection structure 220 and the printed circuit board 150 of the electronic device 100 according to various embodiments.

In the illustrated embodiments, the second connection structure 220 may include a recess 226 (e.g., the recess 206 of FIG. 7), a first sidewall 221 (e.g., the first sidewall 201 of FIG. 7) that forms the recess 226, a second sidewall 222 (e.g., the second sidewall 202 of FIG. 7) that forms the recess 226 and faces the first sidewall 221, a bottom surface 225 (e.g., the bottom surface 205 of FIG. 7) that is formed between the first sidewall 221 and the second sidewall 222, conductive members 2281 and 2282 formed on the first sidewall 221 and the second sidewall 222, respectively, and the printed circuit board 150 disposed in the recess 226. The printed circuit board 150 may include the first printed circuit board 150a and/or the second printed circuit board 150b illustrated in FIGS. 4 and 5.

In the illustrated embodiment, the printed circuit board 150 may include the first surface 151 seated on the bottom surface 225, the second surface 152 opposite to the first surface 151, and side surfaces 153 formed between the first surface 151 and the second surface 152. The side surfaces 153 may be brought into contact with the conductive members 2281 and 2282. The side surfaces 153 may include plated areas 154 containing a metallic material. The plated areas 154 may be electrically connected with the metal portion of the plate structure 142 through the conductive members 2281 and 2282. The plated areas 154 may be formed on at least some of the side surfaces 153 to correspond to the first sidewall 221 and the second sidewall 222 of the recess 226. The printed circuit board 150 may be disposed in the recess 226 such that the plated areas 154 formed on the side surfaces 153 are pressed by the conductive members 2281 and 2282 formed on the sidewalls 221 and 222.

In various embodiments, the printed circuit board 150 may be disposed in the recess 226. At least part of the recess 226 may be formed on the metal portion of the plate structure 142.

In various embodiments, the first conductive member 2281 may be formed on the first sidewall 221. In various embodiments, the second conductive member 2282 may be formed on the second sidewall 222. The first conductive member 2281 and the second conductive member 2282 may protrude toward the side surfaces 153 of the printed circuit board 150, respectively. The first conductive member 2281 and the second conductive member 2282 may be formed to face each other with the printed circuit board 150 therebetween.

In various embodiments, the printed circuit board 150 may include a plurality of layers 1501, 1502, and 1503 formed between the first surface 151 and the second surface 152. The plurality of layers 1501, 1502, and 1503 may include the first conductive layer 1501 including a ground area G, the second conductive layer 1502 including a pattern area P, the insulating layers 1503, and a conductive VIA 156 passing through at least some of the plurality of layers 1501, 1502, and 1503. The insulating layers 1503 may include the first surface 151 and the second surface 152 of the printed circuit board 150.

In the illustrated embodiments, the pattern area P may include a conductive pattern to which a different electrical signal rather than a ground signal is applied. The pattern area P may be electrically insulated from the ground area G, the plated areas 154, and the metal area 155.

Figure 11A:
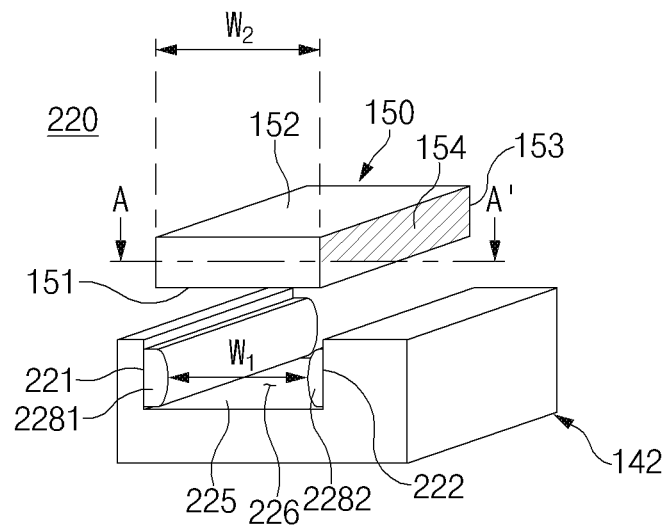
FIGS. 11A, 11B and 11C are diagrams illustrating an example second connection structure of the electronic device according to various embodiments.
Figure 11B:
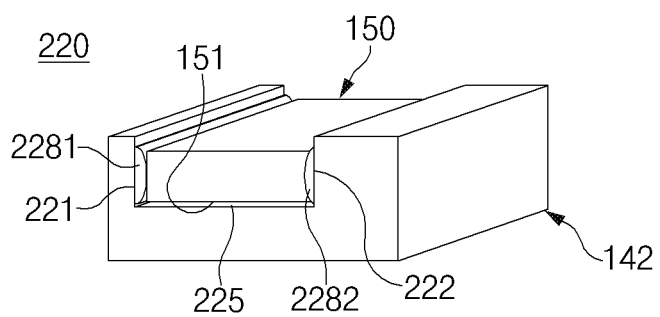
Figure 11C:
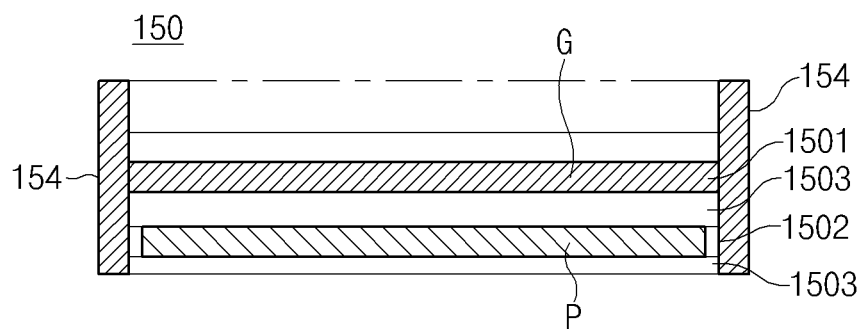

Referring to FIGS. 11A, 11B and 11C, the ground area G may be electrically connected with the plated areas 154 of the printed circuit board 150. The ground area G may extend to the plated areas 154 formed on the side surfaces 153. Accordingly, the ground area G of the printed circuit board 150 may be electrically connected with the metal portion of the plate structure 142 through the plated areas 154 and the conductive members 2281 and 2282.

Figure 12A:
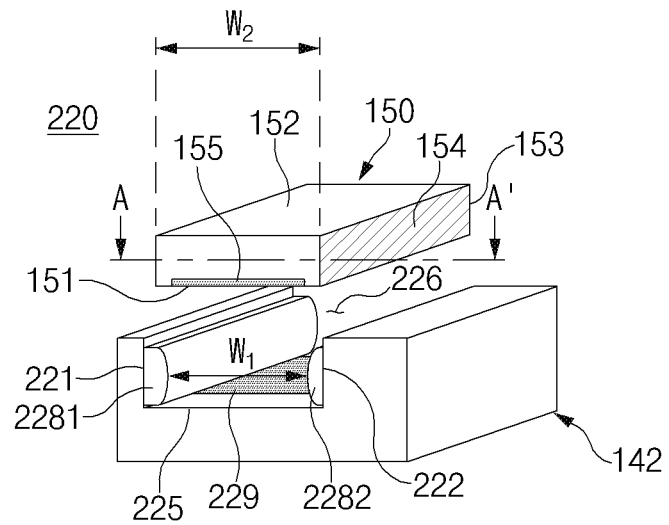
FIGS. 12A, 12B and 12C are diagrams illustrating an example second connection structure of the electronic device according to various embodiments.
Figure 12B:
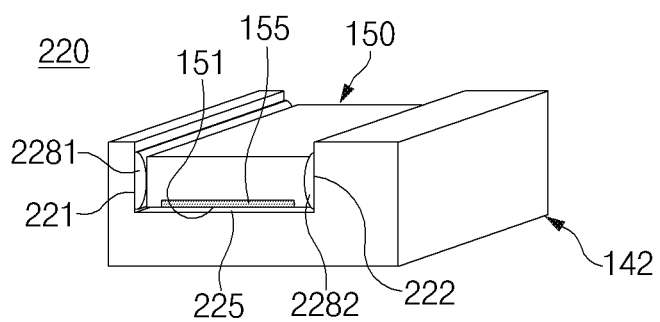
Figure 12C:
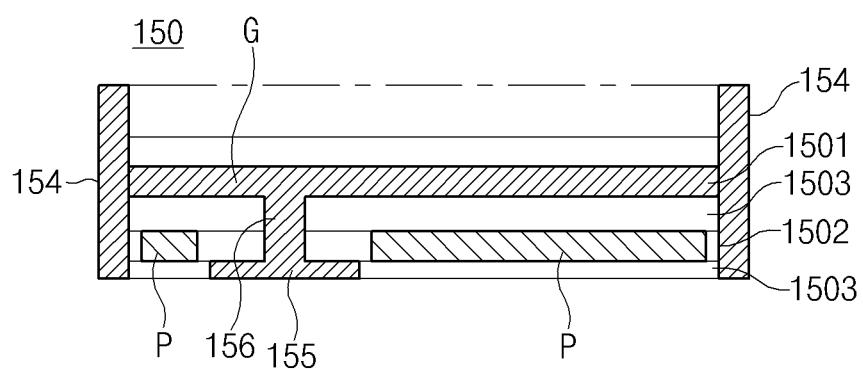

Referring to FIGS. 12A, 12B and 12C, at least part of the bottom surface 225 may be formed of a metal portion. The printed circuit board 150 may include the metal area 155 that is formed on at least part of the first surface 151 facing the bottom surface 225 and that contains a metallic material. The metal area 155 may include an area exposed by removing part of an insulating surface (e.g., the first surface 151) of the printed circuit board 150. The metal area 155 may be electrically connected with the ground area G included in the printed circuit board 150.

Referring to FIGS. 12A, 12B and 12C, the ground area G may be electrically connected with the plated areas 154 and the metal area 155. The ground area G may extend to the plated areas 154 formed on the side surfaces 153. The metal area 155 may be electrically connected with the ground area G, which is included in the first conductive layer 1501, through the VIA 156. The VIA 156 may be electrically insulated from the conductive pattern P included in the second conductive layer 1502. Accordingly, the ground area G of the printed circuit board 150 may be electrically connected with the metal portion of the plate structure 142 through the plated areas 154 and the conductive members 2281 and 2282. The ground area G of the printed circuit board 150 may be electrically connected with the metal portion of the plate structure 142 through the bottom surface 225 and/or a conductive tape 229.

Referring to FIGS. 12A, 12B and 12C, the conductive tape 229 may be additionally disposed between the bottom surface 225 and the printed circuit board 150. The conductive tape 229 may include a double-sided tape containing a conductive material and an adhesive material. Accordingly, the first surface 151 of the printed circuit board 150 may be attached to the bottom surface 225 through the conductive tape 229. The metal area 155 of the printed circuit board 150 may be electrically connected with the metal portion of the plate structure 142 through the conductive tape 229.

In the illustrated embodiments, the conductive members 2281 and 2282 may be formed of a flexible elastic material. The conductive members 2281 and 2282, when compressed, may exert an elastic force to return to the original shape. The conductive members 2281 and 2282 may contain a conductive material. The conductive members 2281 and 2282 may include the first conductive member 2281 formed on the first sidewall 221 and the second conductive member 2282 formed on the second sidewall 222. The first conductive member 2281 and the second conductive member 2282 may be formed to face each other.

In various embodiments, when the printed circuit board 150 is disposed in the recess 226, the first conductive member 2281 may be compressed by being pressed toward the first sidewall 221 by the printed circuit board 150. The compressed first conductive member 2281 may exert an elastic force in a direction of pressing the side surface 153 of the printed circuit board 150. Accordingly, the first conductive member 2281 may make a firm electrical connection with the plated area 154 formed on the side surface 153.

In various embodiments, when the printed circuit board 150 is disposed in the recess 226, the second conductive member 2282 may be compressed by being pressed toward the second sidewall 222 by the printed circuit board 150. The compressed second conductive member 2282 may exert an elastic force in a direction of pressing the side surface 153 of the printed circuit board 150. Accordingly, the second conductive member 2282 may make a firm electrical connection with the plated area 154 formed on the side surface 153.

In various embodiments, in an equilibrium state (e.g., FIG. 11A and FIG. 12A), the distance W1 between the first conductive member 2281 and the second conductive member 2282 may be smaller than the width W2 of the printed circuit board 150.

In some embodiments, the second connection structure 220 may include a third sidewall (e.g., the third sidewall 203 of FIG. 7) that is formed between the first sidewall 221 and the second sidewall 222 and a third conductive member (e.g., the first conductive member 2281 or the second conductive member 2282) that is formed on the third sidewall (e.g., the third sidewall 203 of FIG. 7). The third conductive member may be integrally formed with the first conductive member 2281 and the second conductive member 2282. In various embodiments, the second connection structure 220 may further include a fourth sidewall (e.g., the fourth sidewall 204 of FIG. 7) that faces the third sidewall (e.g., the third sidewall 203 of FIG. 7) and that is formed between the first sidewall 221 and the second sidewall 222. A fourth conductive member may be disposed on the fourth sidewall (e.g., the fourth sidewall 204 of FIG. 7). The fourth conductive member may be integrally formed with the first conductive member 2281 and the second conductive member 2282.

Figure 13A:
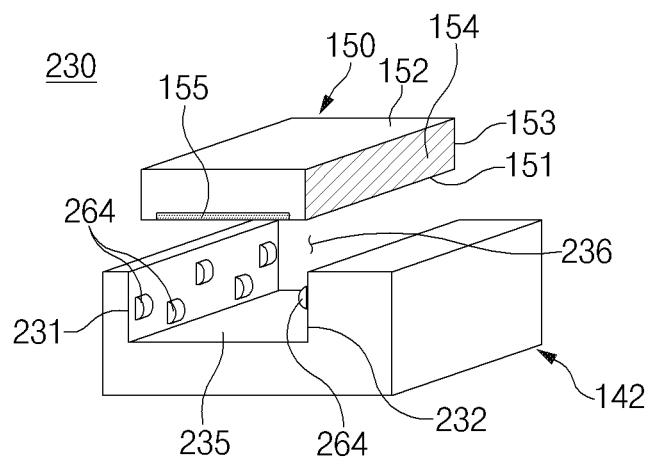
FIGS. 13A and 13B are diagrams illustrating an example third connection structure of the electronic device according to various embodiments.
Figure 13B:
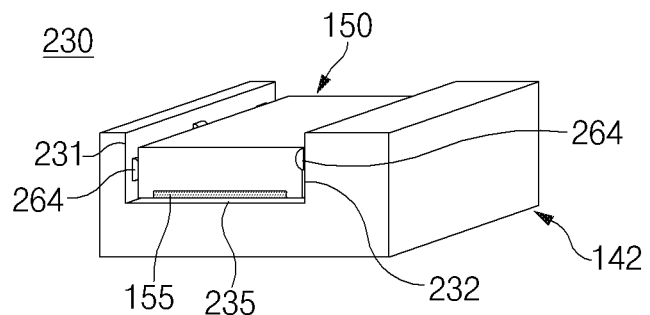

FIGS. 13A and 13B are diagrams illustrating example coupling of an example third connection structure 230 and the printed circuit board 150 of the electronic device 100 according to various embodiments.

In the illustrated embodiment, the third connection structure 230 may include a recess 236 (e.g., the recess 206 of FIG. 7), a first sidewall 231 (e.g., the first sidewall 201 of FIG. 7) that forms the recess 236, a second sidewall 232 (e.g., the second sidewall 202 of FIG. 7) that forms the recess 236 and faces the first sidewall 231, a bottom surface 235 (e.g., the bottom surface 205 of FIG. 7) that is formed between the first sidewall 231 and the second sidewall 232, fourth protrusions 264 formed on the first sidewall 231 and the second sidewall 232, respectively, and the printed circuit board 150 disposed in the recess 236. The printed circuit board 150 may include the first printed circuit board 150a and/or the second printed circuit board 150b illustrated in FIGS. 4 and 5. At least a part of the first sidewall 231, the second sidewall 232, and the bottom surface 235, which form the recess 236, may be formed on the metal portion of the plate structure 142.

In the illustrated embodiment, the printed circuit board 150 may include the first surface 151 seated on the bottom surface 235, the second surface 152 opposite to the first surface 151, and the side surfaces 153 formed between the first surface 151 and the second surface 152. The side surfaces 153 may be brought into contact with the fourth protrusions 264. The side surfaces 153 may include the plated areas 154 containing a metallic material. The plated areas 154 may be electrically connected with the metal portion of the plate structure 142 through the fourth protrusions 264. The plated areas 154 may be formed on at least some of the side surfaces 153 to correspond to the first sidewall 231 and the second sidewall 232 of the recess 236. The printed circuit board 150 may be disposed in the recess 236 such that the plated areas 154 formed on the side surfaces 153 are brought into contact with the fourth protrusions 264 formed on the sidewalls 231 and 232.

In various embodiments, at least part of the bottom surface 235 may be formed of a metal portion. The printed circuit board 150 may include the metal area 155 that is formed on at least part of the first surface 151 facing the bottom surface 235 and that contains a metallic material.

In various embodiments, the printed circuit board 150 may include a ground area (e.g., the ground area 1501 of FIG. 11C) that is formed between the first surface 151 and the second surface 152. The plated areas 154 and the metal area 155 may be electrically connected with the ground area. The ground area of the printed circuit board 150 may be electrically connected with the metal portion of the plate structure 142 through the plated areas 154 and the fourth protrusions 264.

In various embodiments, the plurality of fourth protrusions 264 protruding toward the side surface 153 of the printed circuit board 150 may be formed on each of the first sidewall 231 and the second sidewall 232.

In various embodiments, a conductive tape (e.g., the conductive tape 229 of FIGS. 12A, 12B and 12C) may be additionally disposed between the bottom surface 235 and the printed circuit board 150. For example, the conductive tape may include a double-sided tape containing a conductive material and an adhesive material. Accordingly, the first surface 151 of the printed circuit board 150 may be attached to the bottom surface 235 through the conductive tape. The metal area 155 of the printed circuit board 150 may be electrically connected with the metal portion of the plate structure 142 through the conductive tape (e.g., the conductive tape 229 of FIGS. 12A, 12B and 12C) and the bottom surface 235.

Figure 14:
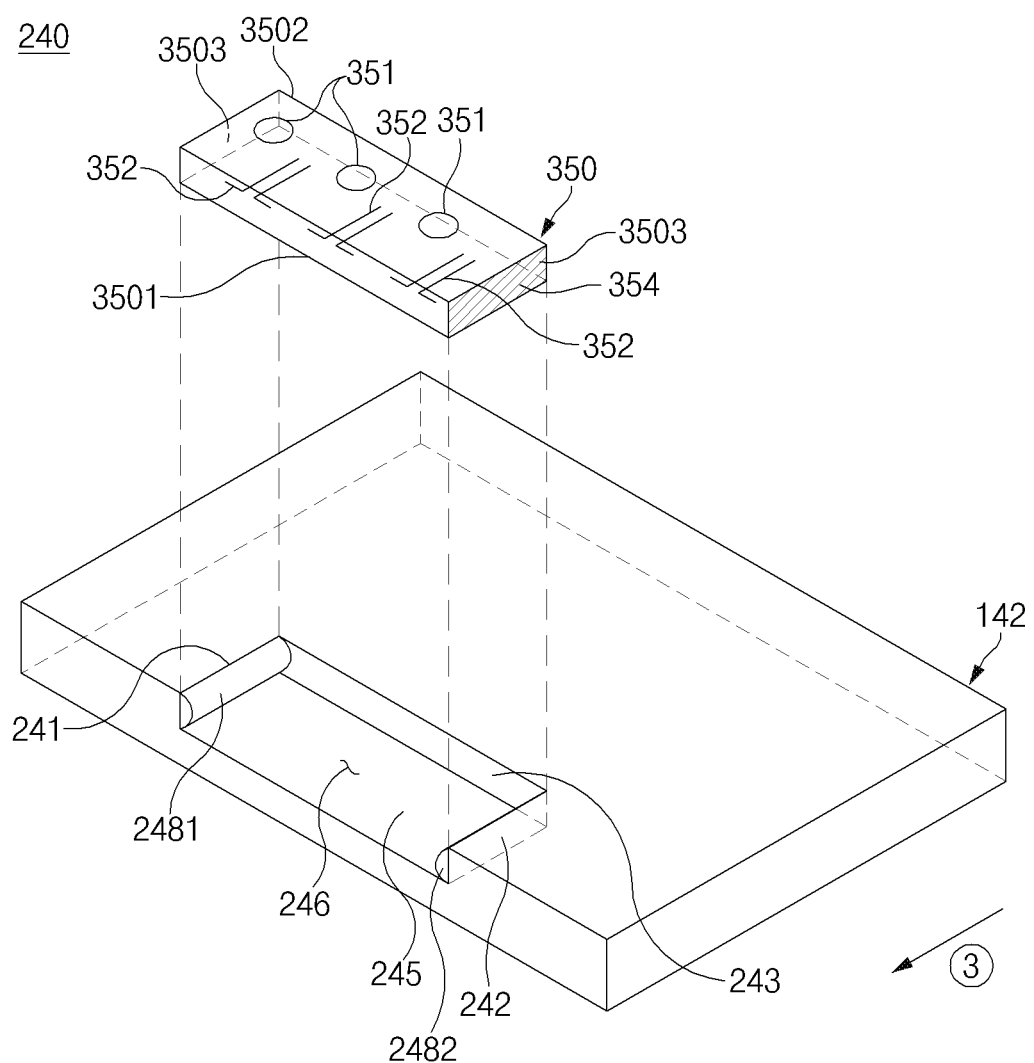
FIG. 14 is a diagram illustrating an example fourth connection structure for grounding an antenna substrate and a housing of the electronic device according to various embodiments.

FIG. 14 is a diagram illustrating an example fourth connection structure 240 for grounding an antenna substrate 350 and the housing of the electronic device according to various embodiments.

In the illustrated embodiment, the fourth connection structure 240 may include a recess 246 formed on the metal portion of the plate structure 142 and the antenna substrate 350 disposed in the recess 246. The recess 246 may include a first sidewall 241, a second sidewall 242 facing the first sidewall 241, a third sidewall 243, and a bottom surface 245. The recess 246 may be formed in a shape that is open on one side (e.g., in a third direction ③).

In the illustrated embodiment, the first sidewall 241 may include a first conductive structure 2481. The second sidewall 242 may include a second conductive structure 2482. The first conductive structure 2481 and the second conductive structure 2482 may protrude toward the recess 246. Each of the first conductive structure 2481 and the second conductive structure 2482 may include the first conductive member 2281, the second conductive member 2282, or the fourth protrusions 264 illustrated in FIGS. 11A, 11B, 11C, 12A, 12B, 12C, 13A and 13B.

In the illustrated embodiment, the first conductive structure 2481 and the second conductive structure 2482 may make contact with plated areas 354 on side surfaces 3503 of the antenna substrate 350, respectively. The third sidewall 243 may be formed between the first sidewall 241 and the second sidewall 242. The third sidewall 243 may face the third direction ③. In some embodiments, the third sidewall 243 may further include a third conductive structure (not illustrated) that makes contact with the plated areas 354 on the side surfaces 3503 of the antenna substrate 350. The third conductive structure may be integrally formed with the first conductive structure 2481 and/or the second conductive structure 2482.

In the illustrated embodiment, a first surface 3501 of the antenna substrate 350 may be seated on the bottom surface 245. In some embodiments, the bottom surface 245 may include a conductive tape (e.g., the conductive tape 229 of FIG. 12A) that is attached to the first surface 3501 of the antenna substrate 350.

In the illustrated embodiment, the antenna substrate 350 may include the first surface 3501, a second surface 3502, and the side surfaces 3503. The antenna substrate 350 may include conductive patterns 351 and 352 inside or on a surface thereof (e.g., the second surface 3502). The conductive patterns 351 and 352 may include the first conductive patterns 351 (e.g., patch antennas) that are configured to radiate electric waves through the second surface 3502 of the antenna substrate 350, and the second conductive patterns 352 (e.g., dipole antennas) that are configured to radiate electric waves through the side surfaces 3503 of the antenna substrate 350.

In the illustrated embodiment, the second conductive patterns 352 may extend in the third direction ③. The second conductive patterns 352 may form a beam pattern extending in the third direction ③. The antenna substrate 350 may be disposed in the recess 246 such that a side surface of the antenna substrate 350 that faces the direction in which the second conductive patterns 352 extend is located on the open side of the recess 246 (e.g., in the third direction ③ in the drawing). For example, when a sidewall (e.g., the third sidewall 243) is located in the direction in which the second conductive patterns 352 extend, electric waves radiated from the second conductive patterns 352 may be reflected or absorbed by a metallic material of the side wall (e.g., the third sidewall 243). Accordingly, the second conductive patterns 352 may extend in the direction in which the recess 246 is open.

In some embodiments, a frame structure (e.g., the frame structure 141 of FIGS. 3 to 5) may be formed on the open side of the recess 246. Portions of the frame structure that correspond to the second conductive patterns 352 may be formed of an insulating material.

An electronic device according to various example embodiments of the disclosure may include: a first cover, a second cover opposite the first cover, a side housing disposed between the first cover and the second cover, the side housing including a plate structure disposed between the first cover and the second cover and a frame surrounding the plate structure, the frame being connected with the first cover and the second cover, a display disposed between the plate structure and the first cover, and a printed circuit board disposed between the plate structure and the second cover, the printed circuit board including a first surface facing the plate structure, a second surface facing the second cover, and side surfaces provided between the first surface and the second surface, wherein at least some of the side surfaces include plated portions. The plate structure may include a connection structure to which the printed circuit board is electrically connected. The connection structure may include a recess, a first sidewall, a second sidewall facing the first sidewall, a first conductive structure including a conductive material disposed on the first sidewall, and a second conductive structure including a conductive material disposed on the second sidewall. At least part of the printed circuit board may be disposed in the recess such that the plated areas make contact with the first conductive structure and the second conductive structure.

In various example embodiments, the connection structure may include a bottom surface, and at least part of the first surface of the printed circuit board may be seated on the bottom surface.

In various example embodiments, the connection structure may further include a conductive tape disposed on the bottom surface, and the conductive tape may attach the first surface of the printed circuit board to the bottom surface of the recess.

In various example embodiments, the plate structure may include a metal portion, and the metal portion may be electrically connected with a ground area G of the printed circuit board through the first conductive structure and the second conductive structure.

In various example embodiments, the printed circuit board may include a plurality of layers including the first surface and the second surface, and the plurality of layers may include a ground area G electrically connected with the plated areas.

In various example embodiments, the connection structure may include a bottom surface between the first sidewall and the second sidewall, and the first surface of the printed circuit board may include a second plated area contacting the bottom surface of the recess and electrically connected with a ground area G included in the printed circuit board.

In various example embodiments, the printed circuit board may further include a conductive VIA extending from the first surface to the ground area G.

In various example embodiments, the first conductive structure and the second conductive structure may include an elastic material, and the first conductive structure and the second conductive structure may be configured to press the plated areas of the printed circuit board toward the recess, respectively.

In various example embodiments, the connection structure may further include a third sidewall between the first sidewall and the second sidewall and a third conductive structure disposed on the third sidewall, and the first conductive structure, the second conductive structure, and the third conductive structure may be integrally formed.

In various example embodiments, the printed circuit board may include a first printed circuit board and a second printed circuit board, and at least one of the first printed circuit board and the second printed circuit board may be disposed in the recess.

In various example embodiments, one of the first printed circuit board and the second printed circuit board may include an antenna substrate having antenna patterns disposed inside or on a surface thereof, the antenna substrate being disposed in the recess. The antenna patterns may include a first antenna pattern configured to radiate electric waves toward the second cover and a second antenna pattern configured to radiate electric waves toward the frame structure. The recess may be open in a direction toward the frame structure.

In various example embodiments, the electronic device may further include a connecting member comprising a conductor that electrically connects the first printed circuit board and the second printed circuit board, and the connecting member may include a flexible printed circuit board (FPCB) and/or a coaxial cable.

In various example embodiments, each of the first conductive structure and the second conductive structure may include a conductive sponge containing an elastic material and a conductive material.

In various example embodiments, the first conductive structure may include a first protrusion protruding toward the recess from the first sidewall, the second conductive structure may include a second protrusion protruding toward the recess from the second sidewall, wherein the first protrusion and the second protrusion contact the plated areas of the printed circuit board.

An electronic device according to various example embodiments of the disclosure may include: a housing, a bracket disposed in the housing, the bracket including a metal portion containing a metallic material, a recess including a bottom surface and a pair of sidewalls facing each other, at least part of the recess being provided on the metal portion of the bracket, a conductive member comprising a conductive material disposed between the pair of sidewalls of the recess, and a printed circuit board seated on a surrounding area around the recess facing the bottom surface of the recess, the printed circuit board including a first surface contacting the conductive member and a second surface opposite the first surface. Each of the pair of sidewalls may include a protrusion protruding toward the conductive member, and the conductive member may, when compressed, press the first surface of the printed circuit board while being supported on the bottom surface of the recess.

In various example embodiments, the protrusion may be formed in plural.

In various example embodiments, the protrusion may protrude from the sidewall to press at least part of the conductive member.

In various example embodiments, the first surface of the printed circuit board may include a plated area electrically connected with a ground area included in the printed circuit board, and the plated area make contact with the conductive member.

In various example embodiments, the conductive member may include a conductive sponge containing an elastic material and a conductive material.

In various example embodiments, the recess may further include a pair of second sidewalls that connect the pair of sidewalls and face each other, and a second protrusion protruding toward the conductive member may be provided on each of the pair of second sidewalls.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used herein, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program) including one or more instructions that are stored in a storage medium (e.g., internal memory or external memory) that is readable by a machine (e.g., the electronic device 100). For example, a processor (e.g., the processor) of the machine (e.g., the electronic device 100) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

According to various example embodiments of the disclosure, the ground area of the printed circuit board may stably make an electrical connection with the metal portion of the housing.

According to various example embodiments of the disclosure, uniform earth resistance may be provided between the printed circuit board and the metal portion of the housing.

In addition, the disclosure may provide various effects that are directly or indirectly recognized.

While the disclosure has been illustrated and described with reference to various example embodiments thereof, it will be understood that the various example embodiments are intended to be illustrative, not limiting. It will further be understood by those skilled in the art that various changes in form and details may be made therein without departing from the true spirit and full scope of the disclosure, including the appended claims and their equivalents.

What is claimed is:

1. An electronic device comprising:
a first cover;
a second cover opposite the first cover;
a side housing disposed between the first cover and the second cover, the side housing including a plate provided between the first cover and the second cover and a frame surrounding the plate and connected with the first cover and the second cover;
a display disposed between the plate and the first cover; and
a printed circuit board disposed between the plate and the second cover, the printed circuit board including a first surface facing the plate, a second surface facing the second cover, and side surfaces between the first surface and the second surface, wherein at least some of the side surfaces include plated areas,
wherein the plate includes a connection structure to which the printed circuit board is electrically connected, the connection structure including a recess, the recess including a first sidewall, a second sidewall facing the first sidewall, a first conductive structure comprising a conductive material disposed on the first sidewall, a second conductive structure comprising a conductive material disposed on the second sidewall, and a bottom surface disposed between the first sidewall and the second sidewall and facing the second cover, and
wherein at least part of the printed circuit board is disposed in the recess such that the plated areas contact the first conductive structure and the second conductive structure, and at least part of the first surface of the printed circuit board is seated on the bottom surface.

2. The electronic device of claim 1, wherein at least one of the first sidewall, the second sidewall, and the bottom surface includes a metal portion electrically connected with a ground area of the printed circuit board through the first conductive structure and the second conductive structure.

3. The electronic device of claim 1, wherein the connection structure further includes a conductive tape disposed on the bottom surface, and
wherein the conductive tape is configured to attach the first surface of the printed circuit board to the bottom surface.

4. The electronic device of claim 1, wherein the plate includes a metal portion, and
wherein the metal portion is electrically connected with a ground area of the printed circuit board through the first conductive structure and the second conductive structure.

5. The electronic device of claim 1, wherein the printed circuit board includes a plurality of layers including the first surface and the second surface, and
wherein the plurality of layers include a ground area electrically connected with the plated areas.

6. The electronic device of claim 1,
wherein the first surface of the printed circuit board includes a second plated area contacting the bottom surface and electrically connected with a ground area included in the printed circuit board.

7. The electronic device of claim 6, wherein the printed circuit board further includes a conductive VIA penetrating from the first surface to the ground area.

8. The electronic device of claim 1, wherein the first conductive structure and the second conductive structure include an elastic material, and
wherein the first conductive structure and the second conductive structure are configured to press the plated areas of the printed circuit board toward the recess.

9. The electronic device of claim 1, wherein the connection structure further includes a third sidewall provided between the first sidewall and the second sidewall and a third conductive structure comprising a conductive material disposed on the third sidewall, and
wherein the first conductive structure, the second conductive structure, and the third conductive structure are integrally formed.

10. The electronic device of claim 1, wherein the printed circuit board includes a first printed circuit board and a second printed circuit board, and
wherein at least one of the first printed circuit board and the second printed circuit board is disposed in the recess.

11. The electronic device of claim 10, wherein one of the first printed circuit board and the second printed circuit board includes an antenna substrate having an antenna pattern disposed inside or on a surface of the antenna substrate, the antenna substrate being disposed in the recess,
wherein the antenna pattern includes a first antenna pattern configured to radiate electric waves toward the second cover and a second antenna pattern configured to radiate electric waves toward the frame, and
wherein the recess is open in a direction toward the frame.

12. The electronic device of claim 10, further comprising:
a connecting member comprising a conductor configured to electrically connect the first printed circuit board and the second printed circuit board,
wherein the connecting member includes a flexible printed circuit board (FPCB) and/or a coaxial cable.

13. The electronic device of claim 1, wherein each of the first conductive structure and the second conductive structure includes a conductive sponge comprising an elastic material and a conductive material.

14. The electronic device of claim 1, wherein the first conductive structure includes a first protrusion protruding toward the recess from the first sidewall,
wherein the second conductive structure includes a second protrusion protruding toward the recess from the second sidewall, and
wherein the first protrusion and the second protrusion contact the plated areas of the printed circuit board.

15. An electronic device comprising:
a housing;
a bracket disposed in the housing, the bracket including a metal portion comprising a metallic material;
a recess including a pair of sidewalls facing each other and a bottom surface disposed between the pair of sidewalls, wherein at least part of the recess is provided on the metal portion of the bracket;
a conductive member comprising a conductive material disposed between the pair of sidewalls of the recess; and
a printed circuit board seated on a surrounding area around the recess facing the bottom surface of the recess, the printed circuit board including a first surface contacting the conductive member and a second surface opposite the first surface,
wherein each of the pair of sidewalls includes a protrusion protruding toward the conductive member, and
the conductive member configured to press the first surface of the printed circuit board while being supported on the bottom surface.

16. The electronic device of claim 15, including a plurality of protrusions protruding from each of the pair of sidewalls.

17. The electronic device of claim 15, wherein the protrusions are configured to press at least part of the conductive member.

18. The electronic device of claim 15, wherein the first surface of the printed circuit board includes a plated area electrically connected with a ground area included in the printed circuit board, and
wherein the plated area contacts the conductive member.

19. The electronic device of claim 15, wherein the conductive member includes a conductive sponge comprising an elastic material and a conductive material.

20. The electronic device of claim 15, wherein the recess further includes a pair of second sidewalls connecting the pair of sidewalls and facing each other, and
wherein a second protrusion protruding toward the conductive member is disposed on each of the pair of second sidewalls.

* * * * *